United States Patent
Lee

(10) Patent No.: US 10,734,085 B2
(45) Date of Patent: Aug. 4, 2020

(54) MEMORY DEVICE AND OPERATING METHOD THEREOF

(71) Applicant: SK hynix Inc., Gyeonggi-do (KR)

(72) Inventor: Dong Hun Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/961,080

(22) Filed: Apr. 24, 2018

(65) Prior Publication Data

US 2019/0051362 A1 Feb. 14, 2019

(30) Foreign Application Priority Data

Aug. 8, 2017 (KR) ........................ 10-2017-0100303

(51) Int. Cl.
| | | |
|---|---|---|
| G11C 16/06 | (2006.01) | |
| G11C 16/34 | (2006.01) | |
| G11C 11/56 | (2006.01) | |
| G11C 16/04 | (2006.01) | |
| G11C 16/10 | (2006.01) | |
| G11C 16/16 | (2006.01) | |
| G11C 16/20 | (2006.01) | |
| G11C 16/24 | (2006.01) | |
| G11C 16/30 | (2006.01) | |
| G11C 16/14 | (2006.01) | |

(52) U.S. Cl.
CPC ...... *G11C 16/3445* (2013.01); *G11C 11/5628* (2013.01); *G11C 11/5635* (2013.01); *G11C 16/0483* (2013.01); *G11C 16/10* (2013.01); *G11C 16/14* (2013.01); *G11C 16/16* (2013.01); *G11C 16/20* (2013.01); *G11C 16/24* (2013.01); *G11C 16/30* (2013.01); *G11C 16/3459* (2013.01); *G11C 16/0466* (2013.01)

(58) Field of Classification Search
CPC ........... G11C 5/16; G11C 16/16; G11C 16/14; G11C 16/3472
USPC ..................................... 365/185.22
See application file for complete search history.

(56) References Cited

U.S. PATENT DOCUMENTS 9,196,317 B2 * 11/2015 Aritome ................. G11C 5/063
9,431,114 B2 * 8/2016 Kang ..................... G11C 16/16
9,646,696 B2  5/2017 Yang
(Continued)

FOREIGN PATENT DOCUMENTS

| KR | 1020100097964 | 9/2010 |
|---|---|---|
| KR | 1020140008705 | 1/2014 |

OTHER PUBLICATIONS

Office Action issued by the USPTO for U.S. Appl. No. 16/816,898 in the same family tree dated Apr. 16, 2020.

*Primary Examiner* — Huan Hoang
*Assistant Examiner* — Minh Dinh
(74) *Attorney, Agent, or Firm* — IP & T Group LLP

(57) ABSTRACT

There are provided a memory device and an operating method thereof. A memory device includes: a peripheral circuit for decreasing threshold voltages of memory cells included in a selected memory block and then performing an erase verify operation for detecting a threshold voltage distribution of the memory cells, wherein the peripheral circuit applies an erase pulse to a well, bit lines or source line in which the selected memory block is included a preset number of times; and a control logic for outputting a voltage setup code according to the threshold voltage distribution of an erase status, which is detected by the erase verify operation.

25 Claims, 15 Drawing Sheets

(56) References Cited

U.S. PATENT DOCUMENTS

| | | | |
|---|---|---|---|
| 9,679,639 B2* | 6/2017 | Lee .................. | G11C 16/14 |
| 9,679,659 B2* | 6/2017 | Shim ................. | G11C 16/16 |
| 9,859,088 B2* | 1/2018 | Shaikh .............. | H01J 37/00 |
| 2012/0269001 A1* | 10/2012 | Ueno ................ | G11C 16/16 |
| | | | 365/185.22 |
| 2016/0172042 A1* | 6/2016 | Kang ................ | G11C 16/32 |
| | | | 365/185.11 |
| 2016/0188231 A1* | 6/2016 | Mittelholzer ....... | G06F 11/1012 |
| | | | 714/704 |
| 2019/0180832 A1* | 6/2019 | Rori ................. | G11C 16/3472 |

* cited by examiner

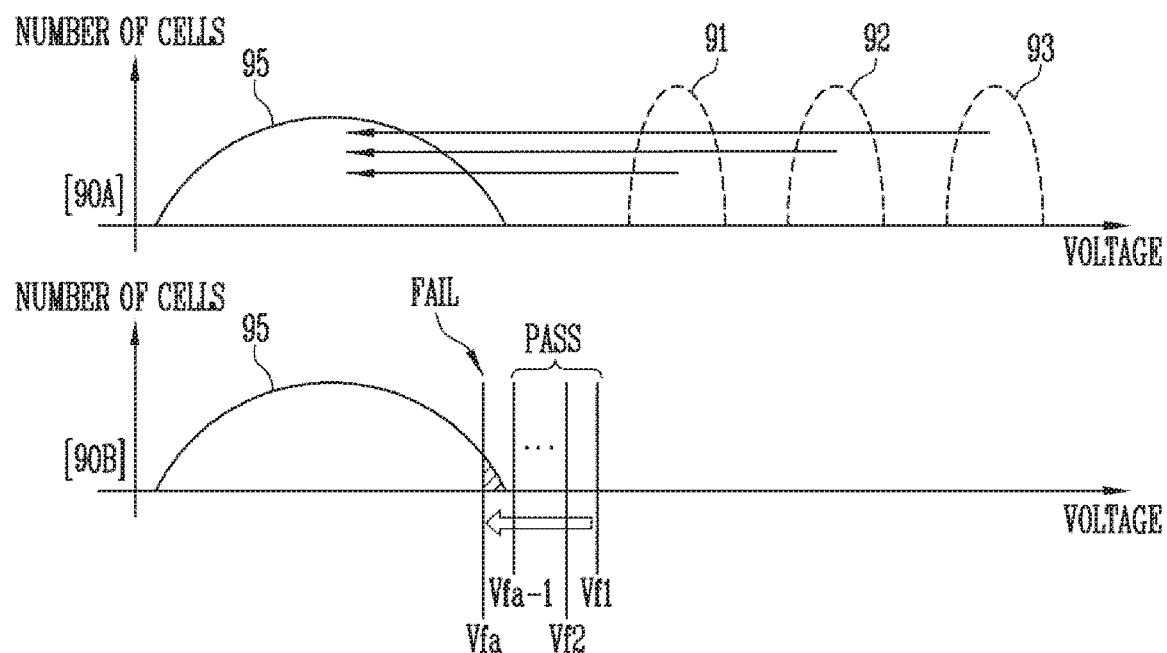

FIG. 18
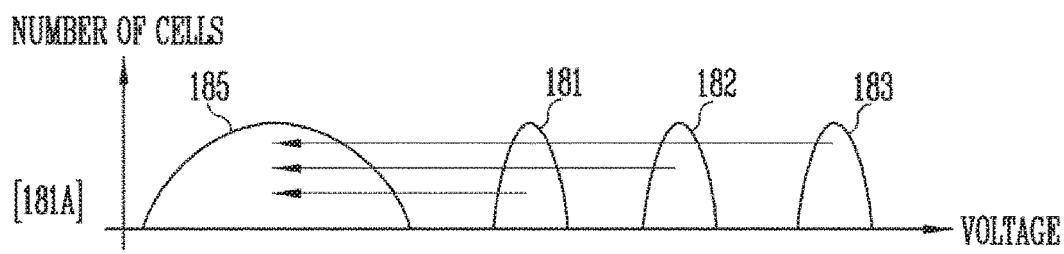
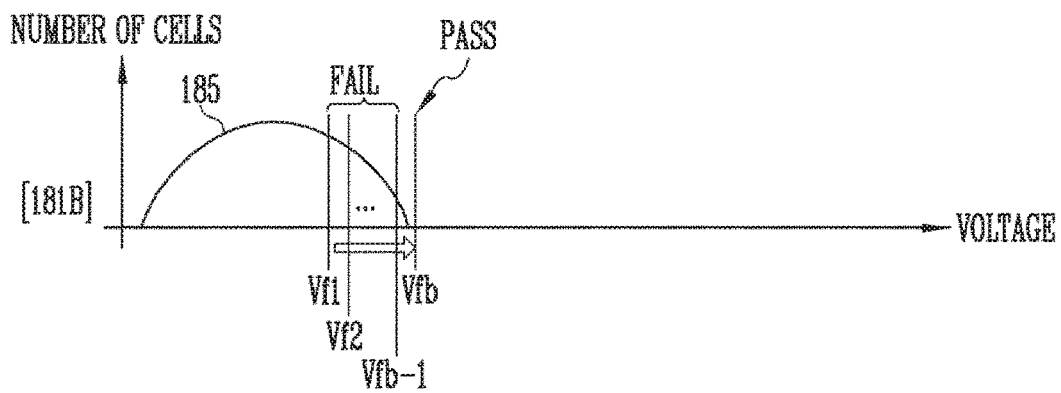
FIG. 19
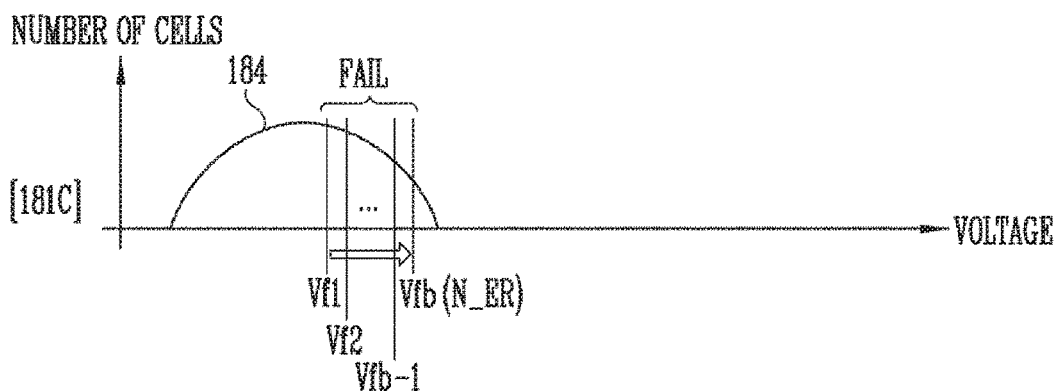
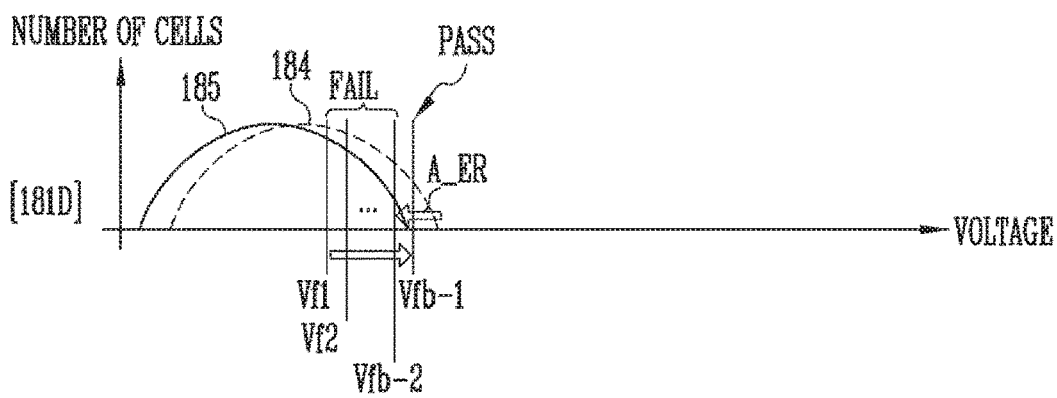

MEMORY DEVICE AND OPERATING METHOD THEREOF

CROSS-REFERENCE TO RELATED APPLICATION

The present application claims priority under 35 U.S.C. § 119(a) to Korean patent application number 10-2017-0100303 filed on Aug. 8, 2017, the entire disclosure of which is incorporated herein by reference.

BACKGROUND

Field of Invention

An aspect of the present disclosure relates to a memory device and an operating method thereof, and more particularly, to a method for performing erase and program operations on a memory device.

Description of Related Art

Memory devices may be classified into volatile and nonvolatile memory devices.

Non-volatile memory devices perform a read/write operation at a relatively lower speed than volatile memory devices, but retain stored data even when a power supply is cut off. Accordingly, non-volatile memory devices are frequently used in portable electronic devices for storing data which need to be retained regardless of whether or not power is supplied to the device.

Examples of non-volatile memory devices include a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), and the like.

Flash memories may be formed in a two-dimensional structure in which strings are horizontally arranged on a semiconductor substrate, or may be formed in a three-dimensional structure in which strings are stacked vertically on a semiconductor substrate. Three-dimensional memory devices were devised for overcoming the limit in the degree of integration of two-dimensional memory devices. A three-dimensional memory device may include a plurality of memory cells stacked vertically on a semiconductor substrate.

SUMMARY

Embodiments provide a memory device with an improved operating speed, and an operating method thereof.

According to an aspect of the present disclosure, there is provided a memory device including: a peripheral circuit configured to decrease threshold voltages of memory cells included in a selected memory block and then perform an erase verify operation for detecting a threshold voltage distribution of the memory cells, wherein the peripheral circuit applies an erase pulse to a well, bit lines or source line in which the selected memory block is included a preset number of times; and a control logic configured to output a voltage setup code according to the threshold voltage distribution of an erase status, which is detected by the erase verify operation.

According to another aspect of the present disclosure, there is provided a method for operating a memory device, the method including: applying an erase pulse to a selected memory block; after the erase pulse is applied, setting a program verify voltage according to an erase status of the selected memory block; and performing a program operation of the selected memory block, using the program verify voltage.

According to yet another aspect of the present disclosure, there is provided a method for operating a memory device, the method including: performing an erase operation on memory cells; setting a program verify voltage according to threshold voltages of the erased memory cells; and performing a program operation on the erased memory cells, using the program verify voltage.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 9 is a diagram illustrating a threshold voltage distribution of memory cells according to the erase operation of the present disclosure.

FIG. 10 is a diagram illustrating status information of a memory block according to the erase operation of the present disclosure.

FIG. 18 is a diagram illustrating a method for searching for an erase verify voltage according to another embodiment of the present disclosure.

FIG. 19 is a diagram illustrating a method for searching for an erase verify voltage according to another embodiment of the present disclosure.

DETAILED DESCRIPTION

In the following detailed description, only certain exemplary embodiments of the present disclosure have been shown and described, simply by way of illustration. As those skilled in the art would realize, the described embodiments may be modified in various different ways without departing from the spirit or scope of the present disclosure. Accordingly, the drawings and description are to be regarded as illustrative in nature and not restrictive.

In the entire specification, when an element is referred to as being "connected" or "coupled" to another element, it can be directly connected or coupled to another element or be indirectly connected or coupled to another element with one or more intervening elements interposed therebetween. In addition, when an element is referred to as "including" a component, this indicates that the element may further include another component unless it is clearly stated otherwise.

Figure 1:
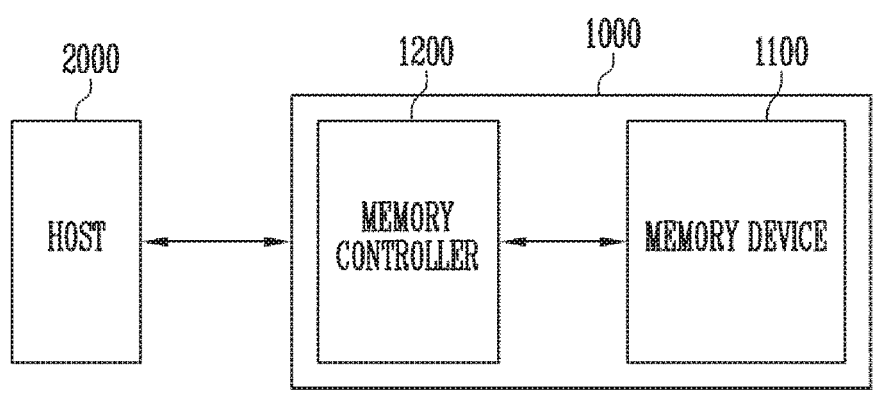
FIG. 1 is a diagram illustrating a memory system according to an embodiment of the present disclosure.

FIG. 1 is a diagram illustrating a memory system according to an embodiment of the present disclosure.

Referring to FIG. 1, the memory system 1000 may include a memory device 1100 that stores data and a memory controller 1200 that controls the memory device 1100 under the control of a host 2000.

The host 2000 may communicate with the memory system 1000 by using an interface protocol such as peripheral component interconnect-express (PCI-E), advanced technology attachment (ATA), serial ATA (SATA), parallel ATA (PATA), or serial attached SCSI (SAS). In addition, interface protocols between the host 2000 and the memory system 1000 are not limited to the above-described examples, and may be one of other interface protocols such as a universal serial bus (USB), a multi-media card (MMC), an enhanced small disk interface (ESDI), and integrated drive electronics (IDE).

The memory controller 1200 may control the overall operations of the memory system 1000, and control data exchange between the host 2000 and the memory device 1100. For example, the memory controller 1200 may program or read data by controlling the memory device 1100 in response to a request of the host 2000. Also, the memory controller 1200 may store information in a main memory block and sub-memory block of the memory device 1100 or information in the main memory block or the sub-memory block of the memory device 1100. The memory controller 1200 may select the memory device 1100 to perform a program operation on a main memory block or a sub-memory block according to the amount of data loaded for the program operation. The memory device 1100 may be or include a double data rate synchronous dynamic random access memory (DDR SDRAM), a low power double data rate 4 (LPDDR4) SDRAM, a graphics double data rate (GDDR) SRAM, a low power DDR (LPDDR), a rambus dynamic random access memory (RDRAM), and a flash memory.

The memory device 1100 may perform a program, read or erase operation under the control of the memory controller 1200.

Figure 2:
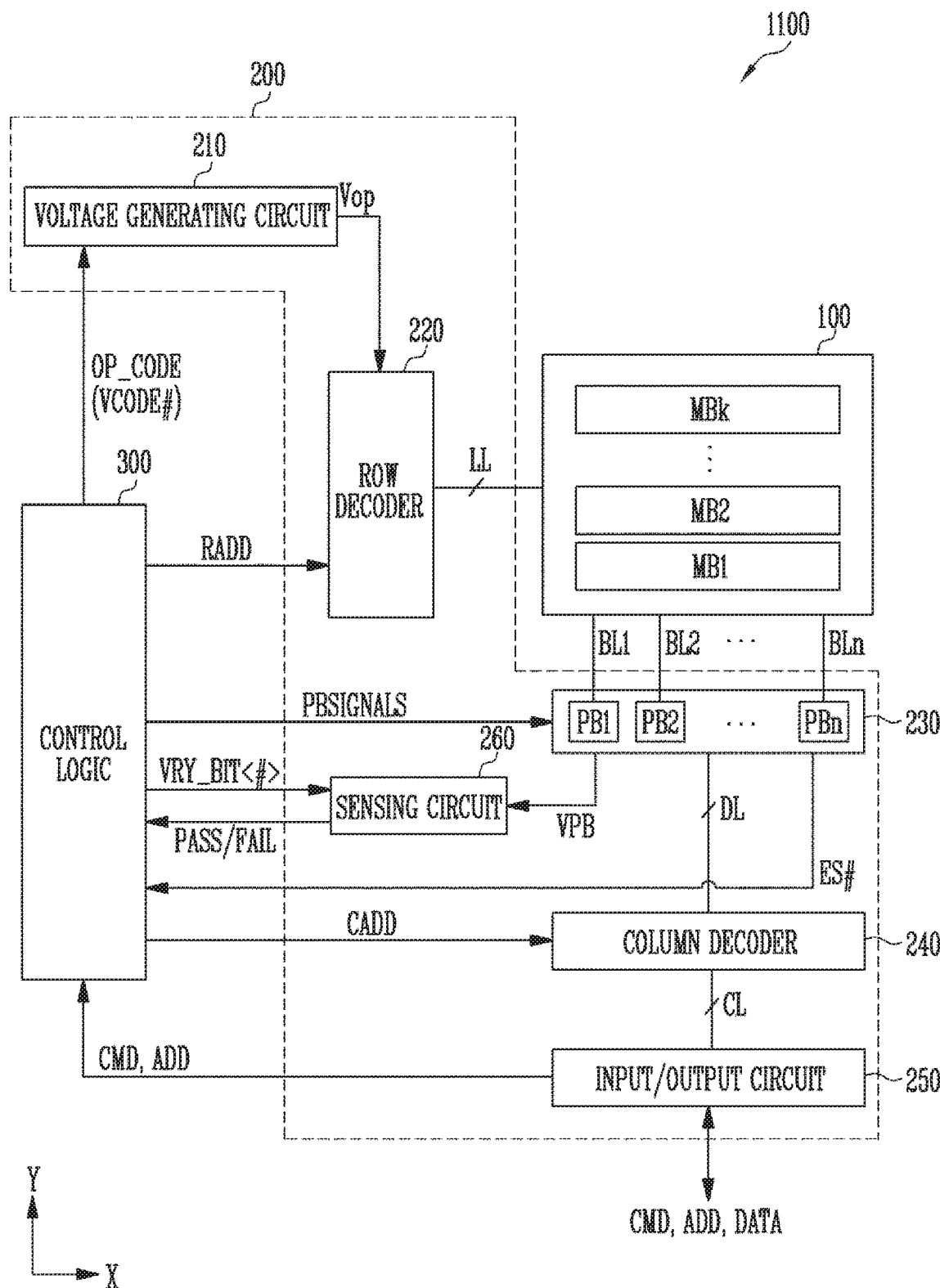
FIG. 2 is a diagram illustrating a memory device shown in FIG. 1.

FIG. 2 is a diagram illustrating an exemplary configuration of the memory device shown in FIG. 1.

Referring to FIG. 2, the memory device 1110 may include a memory cell array 100 that includes a plurality of memory cells for storing data. The memory device 1110 may include a peripheral circuit 200 configured to perform a program operation for storing data in the memory cell array 100, a read operation for outputting the stored data, and an erase operation for erasing the stored data. The peripheral circuit 200 may include a plurality of operatively coupled circuits. The memory device 1100 may include a control logic 300 that controls the peripheral circuit 200 under the control of the memory controller (1200 of FIG. 1).

The memory cell array 100 may include a plurality of memory blocks MB1 to MBk (k is a positive integer). Main data used by a user and flag data used in the memory device 1100 may be stored in the memory blocks MB1 to MBk. Erase status information on an operation of the memory device 1100 may be included in the flag data.

Local lines LL and bit lines BL1 to BLn (n is a positive integer) may be coupled to the memory blocks MB1 to MBk. For example, the local lines LL may include a first select line, a second select line, and a plurality of word lines arranged between the first and second select lines. Also, the local lines LL may further include dummy lines arranged between the first select line and the word lines and between the second select line and the word lines. Here, the first select line may be a source select line, and the second select line may be a drain select line. For example, the local lines LL may include word lines, drain and source select lines, and source lines. For example, when U-shaped strings are included in the memory blocks MB1 to MBk, the local lines LL may further include pipe lines.

The local lines LL may be coupled to the memory blocks MB1 to MBk, respectively. Each of the bit lines BL1 to BLn may be commonly coupled to the plurality of the memory blocks MB1 to MBk. The memory blocks MB1 to MBk may be implemented in a two-dimensional or three-dimensional structure. In an example, pages may be arranged in a direction parallel to a substrate in memory blocks having a two-dimensional structure. In another example, pages may be arranged in a direction vertical to a substrate in memory blocks having a three-dimensional structure.

The peripheral circuit 200 may be configured to perform program, read, and erase operations of a selected memory block under the control of the control logic 300. For example, in an erase operation of a selected memory block, the peripheral circuit 200, under the control of the control logic 300, may apply an erase pulse to a well of the selected memory block at least once, perform an erase verify operation on the selected memory block, store a result of the erase verify operation in flag cells of the selected memory block, and perform a program operation on the selected memory block, based on information stored in the flag cells. Alternatively, the peripheral circuit 200 may erase memory cells by applying an erase voltage to bit lines or a source line SL in an erase operation.

For example, the peripheral circuit 200 may include a voltage generating circuit 210, a row decoder 220, a page buffer group 230, a column decoder 240, an input/output circuit 250, and a sensing circuit 260.

The voltage generating circuit 210 may generate various operating voltages Vop used for program, read, and erase operations in response to an operation code OP_CODE received form the control logic 300. Various codes for generating various voltages used in various operations may be included in the operation code OP_CODE. For example, a voltage setup code VCODE # to be used in the erase operation and the program operation may be included in the operation code OP_CODE. The voltage setup code VCODE # will be described in FIG. 11.

The row decoder 220 may transfer the operating voltages Vop to local lines LL coupled to a selected memory block in response to a row address RADD received from the control logic 300.

The page buffer group 230 may include a plurality of page buffers PB1 to PBn coupled to the respective bit lines BL1 to BLn. The page buffers PB1 to PBn may operate in response to page buffer control signals PBSIGNALS received from the control logic 300. For example, the page buffers PB1 to PBn may temporarily store data received through the bit lines BL1 to BLn, or sense voltages or current of the bit lines BL1 to BLn in a read or verify operation. Also, the page buffer group 230 may transmit erase status information ES # read from flag cells to the control logic 300 in a program operation. Also, the page buffer group 230 may transmit a sensing voltage VPB received from memory cells to the sensing circuit 260 in a sensing operation.

The column decoder 240 may transfer data between the input/output circuit 250 and the page buffer group 230 in response to a column address CADD received form the control logic 300. For example, the column decoder 240 may exchange data with the page buffers PB through data lines DL, or exchange data with the input/output circuit 250 through column lines CL.

The input/output circuit 250 may transfer a command CMD and address ADD, which are received from the memory controller (1200 of FIG. 1), to the control logic 300, or exchange data DATA with the column decoder 240.

The sensing circuit 260, in a read operation and a verify operation, may generate a reference current in response to a permission bit VRY_BIT<#>, and output a pass signal PASS or a fail signal FAIL by comparing a sensing voltage VPB received from the page buffer group 230 with a reference voltage generated by the reference voltage.

The control logic 300 may control the peripheral circuit 200 by outputting the operation code OP_CODE, the row address RADD, the page buffer control signals PBSIGNALS, and the permission bit VRY_BIT<#> in response to the command CMD and the address ADD. Also, the control logic 300 may determine whether the verify operation has passed or failed in response to the pass or fail signal PASS or FAIL. In particular, if it is determined that an erase verify operation has passed in the erase operation, the control logic 300 may control the peripheral circuit 200 such that the erase verify operation is performed by adjusting an erase verify voltage. For example, the control logic 300 may control the peripheral circuit 200 such that the erase verify operation is repeated while allowing the erase verify voltage to be decreased by a set offset. If it is determined that the erase verify operation has failed, the control logic 300 may control the peripheral circuit 200 such that the erase status information ES # is stored in flag cells of a selected memory block. That is, in the erase verify operation, if a memory cell having a threshold voltage higher than the erase verify voltage is detected, it may be determined that the erase verify operation has failed.

The control logic 300, in a program operation, may set a program verify voltage, based on the erase status information, and control the peripheral circuit 200 such that the program operation can be performed using the set program verify voltage.

Figure 3:
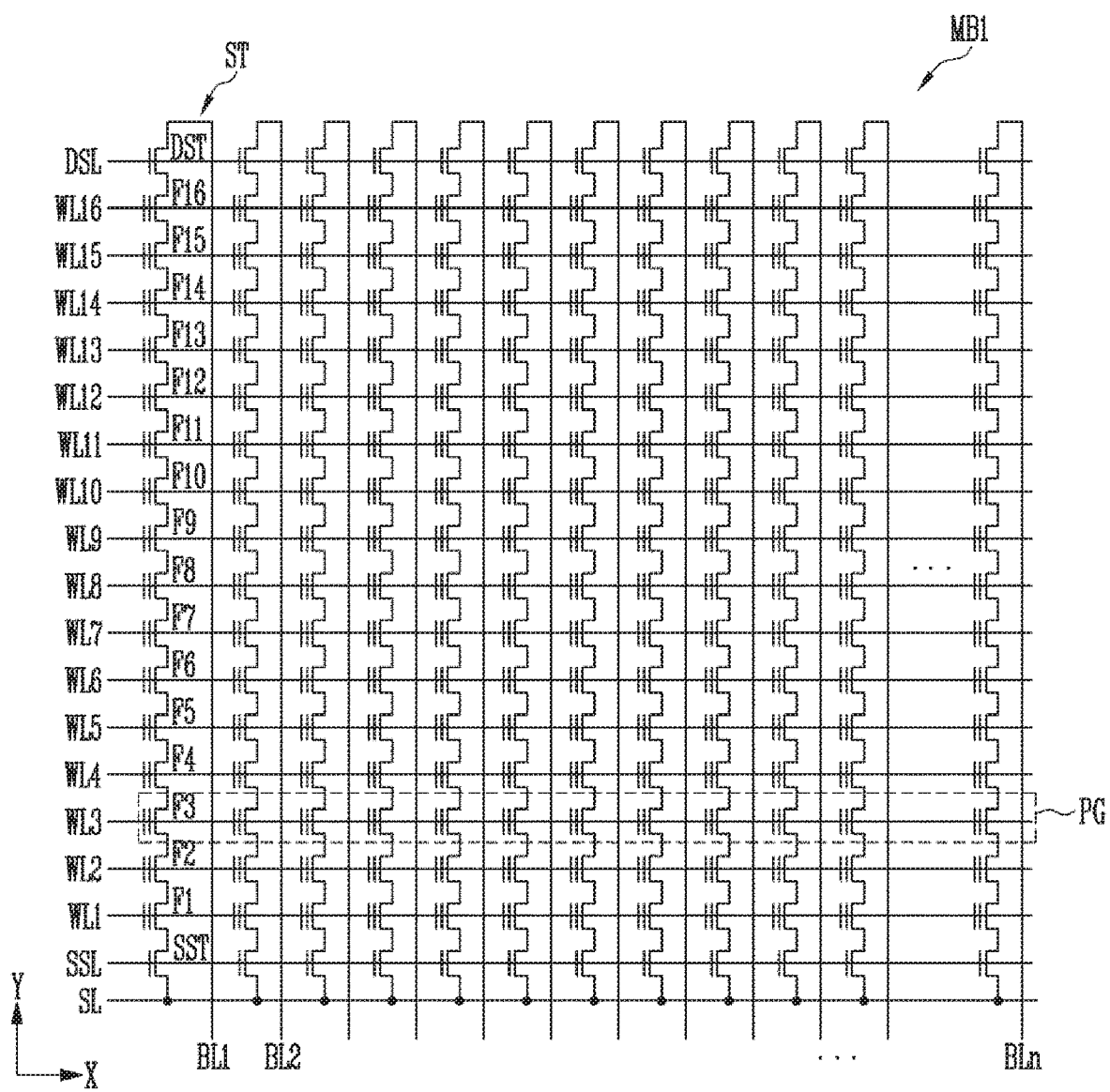
FIG. 3 is a diagram illustrating a memory block shown in FIG. 2.

FIG. 3 is a diagram illustrating an exemplary configuration of the memory block of FIG. 2. A first memory block MB1 will be described as an example.

Referring to FIG. 3, a plurality of word lines arranged in parallel to one another between a first select line and a second select line may be coupled to the first memory block MB1. Here, the first select line may be a source select line SSL, and the second select line may be a drain select line DSL. More specifically, the first memory block MB1 may include a plurality of strings ST coupled between bit lines BL1 to BLn and a source line SL. The bit lines BL1 to BLn may be coupled to the strings ST, respectively, and the source line SL may be commonly coupled to the strings ST. The strings ST may be configured identically to one another, and therefore, a string ST coupled to a first bit line BL1 will be described in detail as an example.

The string ST may include a source select transistor SST, a plurality of memory cells F1 to F16, and a drain select transistor DST, which are coupled in series to each other between the source line SL and the first bit line BL1. At least one source select transistor SST and at least one drain select transistor DST may be included in one string ST, and memory cells of which number is larger than that of the memory cells F1 to F16 shown in the drawing may be included in one string ST.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of source select transistors SST included in different strings ST may be coupled to the source select line SSL, gates of drain select transistors DST included in different strings ST may be coupled to the drain select line DSL, gates of the memory cells F1 to F16 included in different strings ST may be coupled to a plurality of word lines WL1 to WL16. A group of memory cells coupled to the same word line among the memory cells included in different strings ST may be a page PG. Therefore, a plurality of pages PG corresponding in number to that of the word lines WL1 to WL16 may be included in the first memory block MB1.

Figure 4:
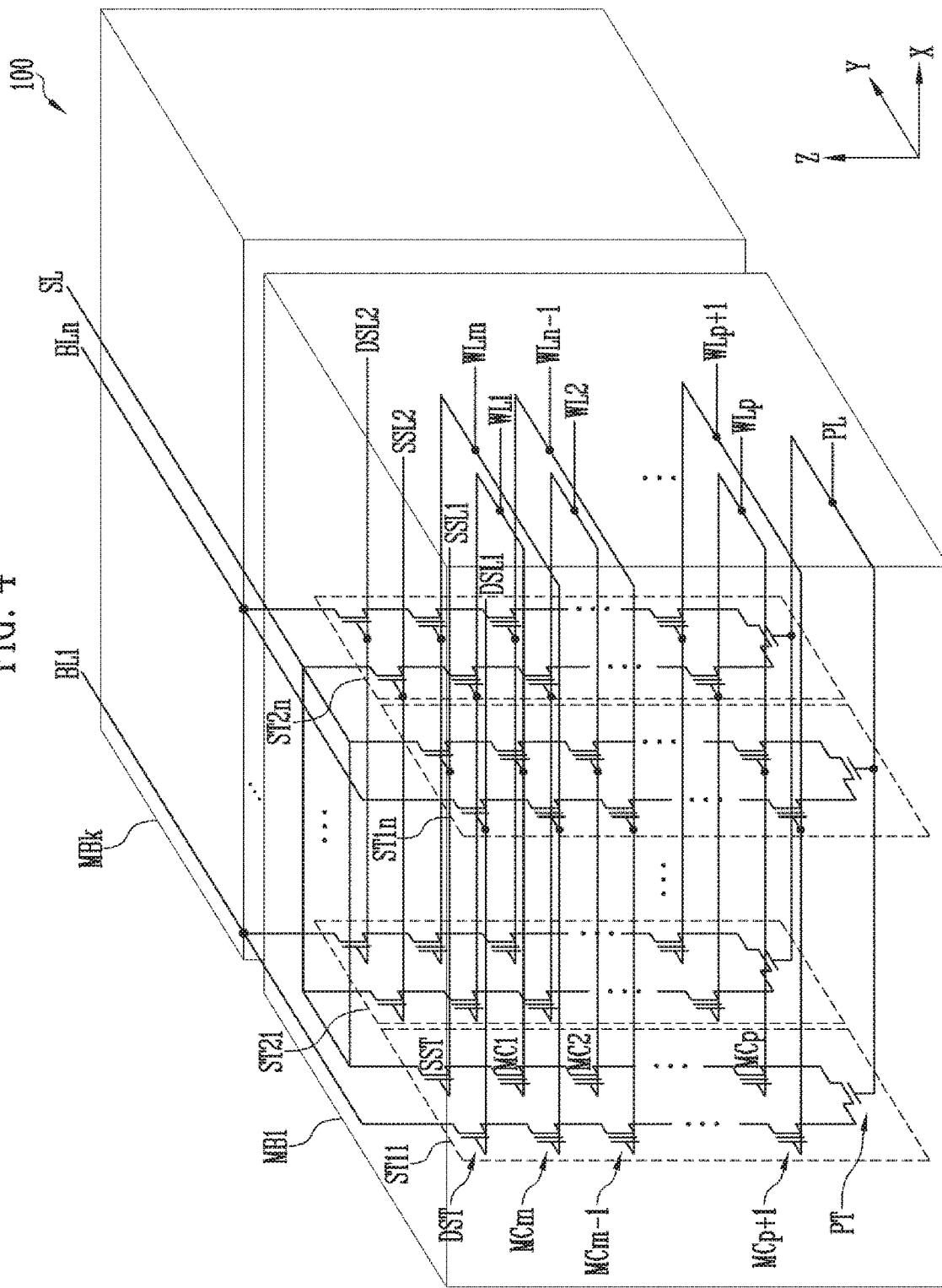
FIG. 4 is a diagram illustrating an embodiment in which the memory block of FIG. 2 is three-dimensionally configured.

FIG. 4 is a diagram illustrating an embodiment in which the memory block of FIG. 2 is three-dimensionally configured.

Referring to FIG. 4, the memory cell array 100 may include a plurality of memory blocks MB1 to MBk. In FIG. 4, an internal configuration of the first memory block MB1 is illustrated for helping of understanding, and internal configurations of the other memory blocks MB2 to MBk are omitted. Second to kth memory blocks MB2 to MBk may also be configured identically to the first memory block MB1.

The first memory block MB1 may include a plurality of strings ST11 to ST1n and ST21 to ST2n. In an embodiment, each of the plurality of strings ST11 to ST1n and ST21 to ST2n may be formed in a 'U' shape. In the first memory block MB1, m strings may be arranged in a row direction (X direction). In FIG. 4, it is illustrated that two strings are arranged in a column direction (Y direction). However, this is for convenience of description, and three or more strings may be arranged in the column direction (Y direction).

Each of the plurality of strings ST11 to ST1n and ST21 to ST2n may include at least one source select transistor SST, first to mth memory cells MC1 to MCm, a pipe transistor PT, and at least one drain select transistor DST.

The source and drain select transistors SST and DST and the memory cells MC1 to MCm may have structures similar to one another. For example, each of the source and drain select transistors SST and DST and the memory cells MC1 to MCm may include a channel layer, a tunnel insulating layer, a charge trapping layer, and a blocking insulating layer. For example, a pillar for providing the channel layer may be provided in each string. For example, a pillar for providing at least one of the channel layer, the tunnel insulating layer, the charge trapping layer, and the blocking insulating layer may be provided in each string.

The source select transistor SST of each string may be coupled between a source line SL and memory cells MC1 to MCp.

In an embodiment, source select transistors of strings arranged in the same row may be coupled to a source select line extending in the row direction, and source select transistors of strings arranged in different rows may be coupled to different source select lines. In FIG. 4, source select transistors of strings ST11 to ST1n of a first row may be coupled to a first source select line SSL1. Source select transistors of strings ST21 to ST2n of a second row may be coupled to a second source select line SSL2.

In another embodiment, the source select transistors of the strings ST11 to ST1n and ST21 to ST2n may be commonly coupled to one source select line.

First to mth memory cells MC1 to MCm of each string may be coupled between the source select transistor SST and the drain select transistor DST.

The first to mth memory cells MC1 to MCm may be divided into first to pth memory cells MC1 to MCp and (p+1)th to mth memory cells MCp+1 to MCm. The first to pth memory cells MC1 to MCp may be sequentially arranged in a vertical direction (Z direction), and be coupled in series to each other between the source select transistor SST and the pipe transistor PT. The (p+1)th to mth memory cells MCp+1 to MCm may be sequentially arranged in the vertical direction (Z direction), and be coupled in series to each other between the pipe transistor PT and the drain select transistor DST. The first to pth memory cells MC1 to MCp and the (p+1)th to mth memory cells MCp+1 to MCm may be coupled to each other through the pipe transistor PT. Gates of the first to mth memory cells MC1 to MCm of each string may be coupled to first to mth word lines WL1 to WLm, respectively.

In an embodiment, at least one of the first to mth memory cells MC1 to MCm may be used as a dummy memory cell. When a dummy memory cell is provided, the voltage or current of a corresponding string can be stably controlled. A gate of the pipe transistor PT of each string may be coupled to a pipe line PL.

The drain select transistor DST of each string may be coupled to a bit line and the memory cells MCp+1 to MCm. Strings arranged in the row direction may be coupled to a drain select line extending in the row direction. Drain select transistors of the strings ST11 to ST1n of the first row may be coupled to a first drain select line DSL1. Drain select transistors of the strings ST21 to ST2n of the second row may be coupled to a second drain select line DSL2.

Strings arranged in the column direction may be coupled to bit lines extending in the column direction. In FIG. 4, strings ST11 and ST21 of a first column may be coupled to a first bit line BL1. Strings ST1n and ST2n of an nth column may be coupled to an nth bit line BLn. Memory cells coupled to the same word line among the strings arranged in the row direction may constitute one page. For example, memory cells coupled to the first word line WL1 among the strings ST11 to ST1n of the first row may constitute one page. Memory cells coupled to the first word line WL1 among the strings ST21 to ST2n of the second row may constitute another page. As any one of the drain select lines DSL1 and DSL2 is selected, strings arranged in one row direction may be selected. As any one of the word lines WL1 to WLm is selected, one page among the selected strings may be selected.

Figure 5:
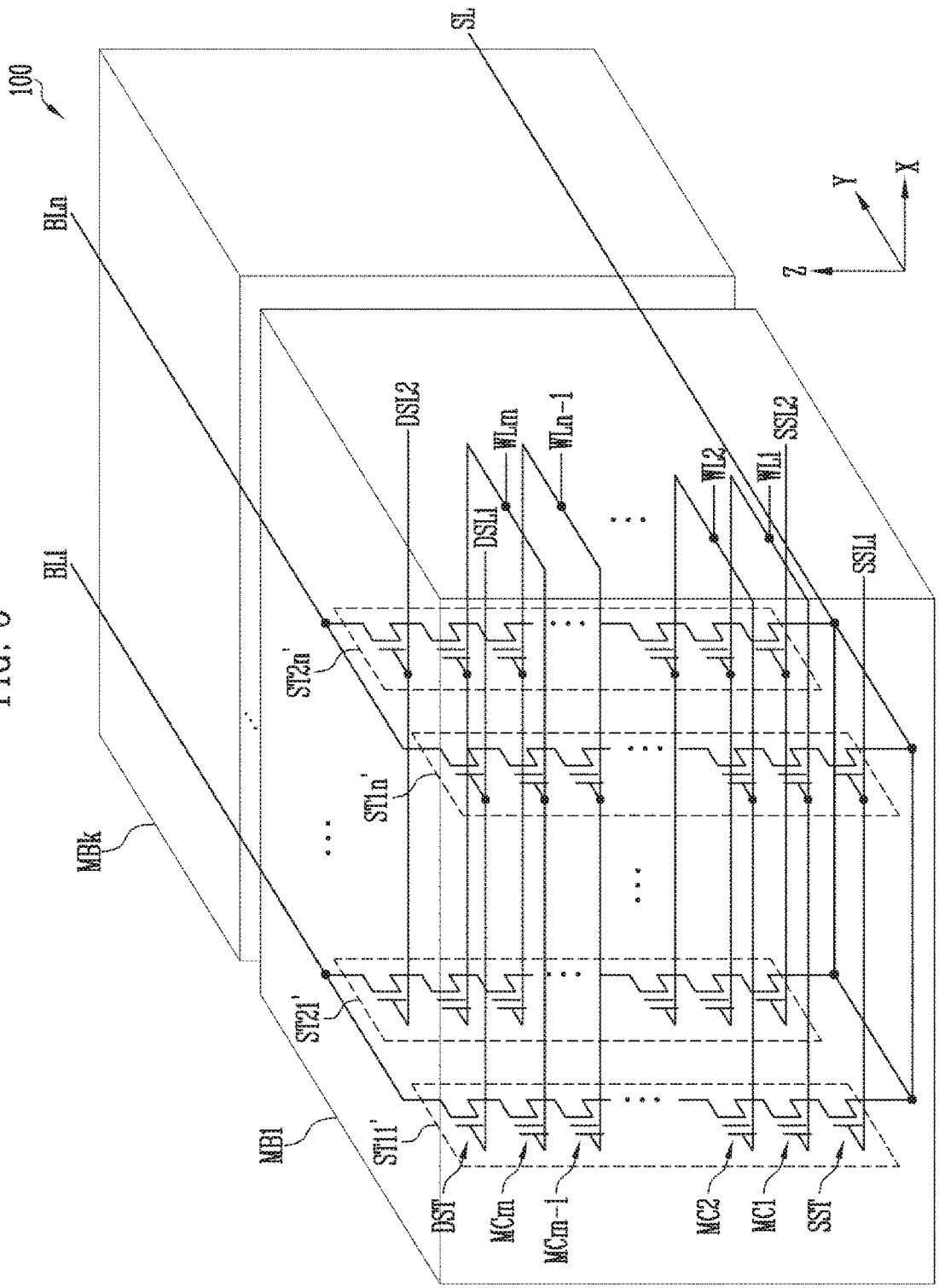
FIG. 5 is a diagram illustrating another embodiment in which the memory block of FIG. 2 is three-dimensionally configured.

FIG. 5 is a diagram illustrating another embodiment in which the memory block of FIG. 2 is three-dimensionally configured.

Referring to FIG. 5, the memory cell array 100 may include a plurality of memory blocks MB1 to MBk. In FIG. 5, an internal configuration of the first memory block MB1 is illustrated for helping of understanding, and internal configurations of the other memory blocks MB2 to MBk are omitted. Second to kth memory blocks MB2 to MBk may also be configured identically to the first memory block MB1.

The first memory block MB1 may include a plurality of strings ST11' to ST1n' and ST21' to ST2n'. Each of the plurality of strings ST11' to ST1n' and ST21' to ST2n' may extend along a vertical direction (Z direction). In the first memory block MB1, n strings may be arranged in a row direction (X direction). In FIG. 5, it is illustrated that two strings are arranged in a column direction (Y direction). However, this is for convenience of description, and three or more strings may be arranged in the column direction (Y direction).

Each of the plurality of strings ST11' to ST1n' and ST21' to ST2n' may include at least one source select transistor SST, first to mth memory cells MC1 to MCm, a pipe transistor PT, and at least one drain select transistor DST.

The source select transistor SST of each string may be coupled between a source line SL and the memory cells MC1 to MCm. Source select transistors of strings arranged in the same row may be coupled to the same source select line. Source select transistors of strings ST11' to ST1n' arranged on a first row may be coupled to a first source select line SSL1. Source select transistors of strings ST21' to ST2n' arranged on a second row may be coupled to a second source select line SSL2. In another embodiment, the source select transistors of the strings ST11' to ST1n' and ST21' to ST2n' may be commonly coupled to one source select line.

The first to mth memory cells MC1 to MCm of each string may be coupled in series to each other between the source select transistor SST and the drain select transistor DST.

Gates of the first to mth memory cells MC1 to MCm may be coupled to first to mth word lines WL1 to WLm, respectively.

In an embodiment, at least one of the first to mth memory cells MC1 to MCm may be used as a dummy memory cell. When a dummy memory cell is provided, the voltage or current of a corresponding string can be stably controlled. Accordingly, the reliability of data stored in the first memory block MB1 can be improved.

The drain select transistor DST of each string may be coupled between a bit line and the memory cells MC1 to MCm. Drain select transistors DST of strings arranged in the row direction may be coupled to a drain select line extending in the row direction. The drain select transistors DST of the strings ST11' to S1n' of the first row may be coupled to a first drain select line DSL1. The drain select transistors DST of the strings ST21' to Stn' of the second row may be coupled to a second drain select line DSL2.

That is, the first memory block MB1 of FIG. 5 may have an equivalent circuit similar to that of the first memory block MB1 of FIG. 4, except that the pipe transistor PT is excluded from each string.

Figure 6:
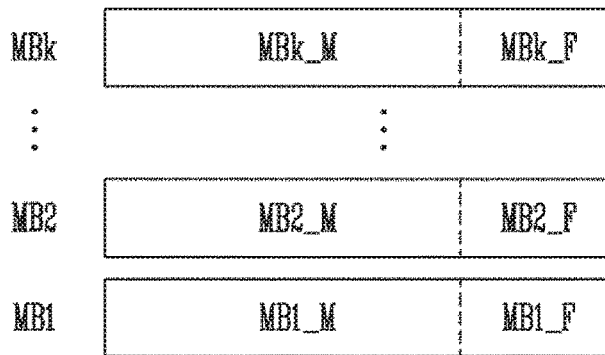
FIG. 6 is a diagram illustrating a memory block according to an embodiment of the present disclosure.

FIG. 6 is a diagram illustrating a memory block according to an embodiment of the present disclosure.

Referring to FIG. 6, the memory blocks MB1 to MBk may include flag storage areas MB1_F to MBk_F so as to store erase status information of a corresponding memory block if it is determined that an erase verify operation has failed in an erase operation to the corresponding memory block. For example, the memory blocks MB1 to MBk may include main storage areas MB1_M to MBk_M and flag storage areas MB1_F to MBk_F such that main data and flag data are stored to be distinguished from each other. That is, the first memory block MB1 may include a first main storage area MB1_M and a first flag storage area MB1_F. In other words, all pages included in the first memory block MB1 may be included in the first main storage area MBk_M and the first flag storage area MB1_F. For example, flag data including information necessary for an operation of the memory device 1100 may be stored in flag cells included in the flag storage areas MB1_F to MBk_F. For example, erase status information on an operation of the memory device 1100 may be included in the flag data.

Figure 7:
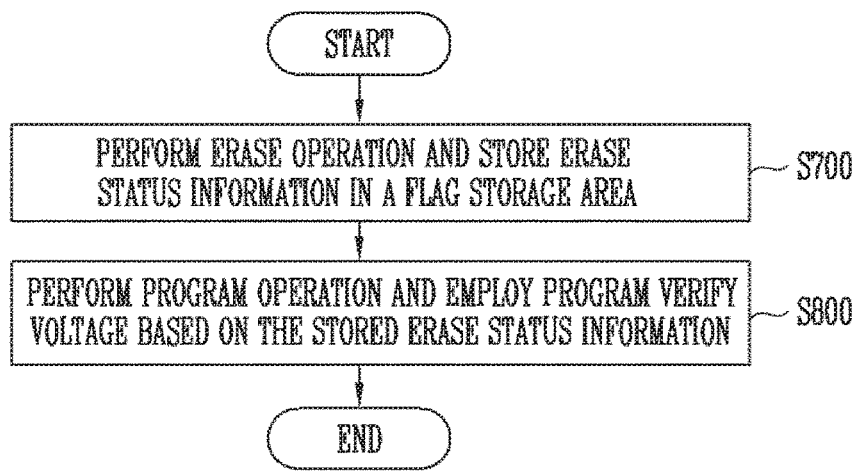
FIG. 7 is a flowchart illustrating an operating method of the memory device according to an embodiment of the present disclosure.

FIG. 7 is a flowchart illustrating an operating method of the memory device according to an embodiment of the present disclosure.

Referring to FIG. 7, the memory device 1100 may perform an erase operation of a selected memory block at step S700 before a program operation of the selected memory block is performed at step S800. According to the embodiment of the present disclosure, in the erase operation of step S700, erase status information of the selected memory block may be stored in a flag storage area included in the selected memory block.

According to the embodiment of the present disclosure, in the program operation of step S800, a program verify voltage may be determined based on the erase status information stored in the flag storage area of the selected memory block, and the program operation of a main storage area may be performed based on the determined program verify voltage. If the program verify voltage is changed, threshold voltages of programmed memory cells are also changed. Therefore, in a subsequent read operation to the selected memory block, a read voltage may also be determined based on the erase status information stored in the flag storage area of the selected memory block.

Figure 8:
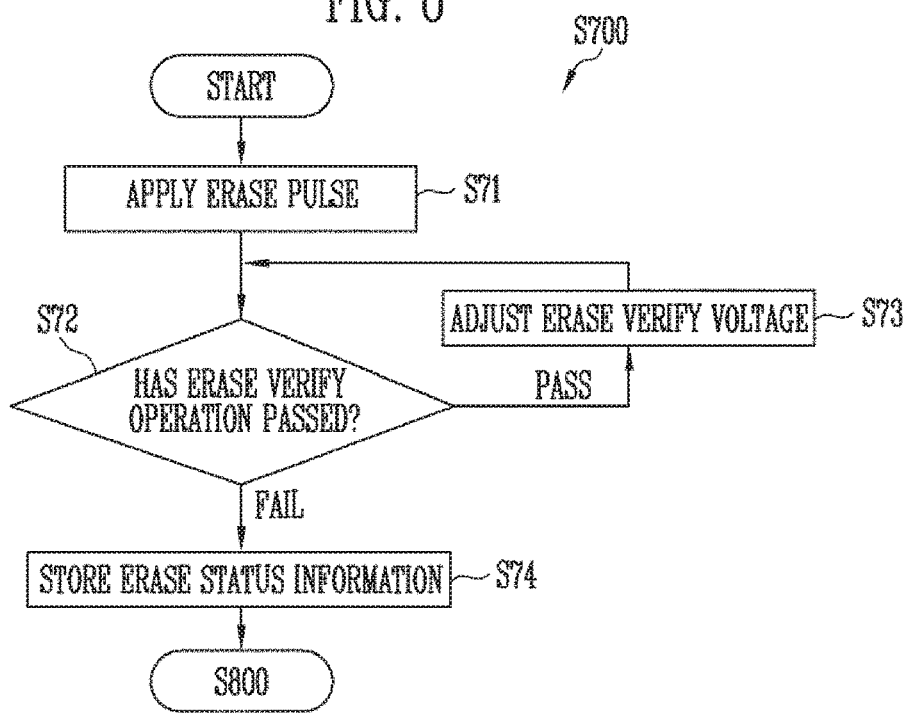
FIG. 8 is a flowchart illustrating in detail an erase operation shown in FIG. 7.

FIG. 8 is a flowchart illustrating in detail the erase operation of FIG. 7.

Referring to FIG. 8, the erase operation may be performed on the entire selected memory block at step S71. For example, threshold voltages of memory cells included in the selected memory block may be decreased by applying an erase pulse to a well, bit lines or source line including the selected memory block.

The erase pulse may be a pulse having an erase voltage level (e.g., a positive voltage). In this case, an erase permission voltage may be applied to word lines coupled to the selected memory block, and an erase prohibition voltage may be applied to word lines coupled to unselected memory cells that share the well to which the erase pulse is applied. The erase permission voltage may be a ground voltage (e.g., 0V), and the erase prohibition voltage may be a positive voltage similar to the voltage of the erase pulse.

At step S71, the erase pulse may be applied to the well, bit lines or source line at least once. However, in this embodiment, the erase pulse is applied a small number of times as compared with an erase operation of an incremental step pulse erase (ISPE) scheme. For example, the erase pulse may be applied to the well, bit lines or source line once. In this case, an erase pulse having a level higher than that of a preset erase voltage may be applied to the well, bit lines or source line. Hence, since the threshold voltages of the memory cells are decreased even when the erase pulse applied once is used, the erase operation time can be reduced. In another example, the erase pulse may be applied to the well, bit lines or source line two or more times. In this case, an erase pulse having the level of the preset erase voltage may be used as a start pulse, and erase pulses having levels which are increased by an erase step voltage may be consecutively applied to the well, bit lines or source line. In addition, according to an embodiment of the present invention, when the erase pulse is applied to the well, bit lines or source line a plurality of times, only erase pulses are consecutively applied to the well, bit lines or source line without any erase verify operation. In the above-described erase operation, the levels of the start pulse and the erase step voltage may be variously set depending on the electrical characteristics of the memory device.

After the application of an erase pulse or multiple erase pulse to the well, bit lines or source line a fixed number of times, an erase verify operation of the selected memory block may be performed at step S72. The erase verify operation may be simultaneously performed on all pages included in the selected memory block, or be sequentially performed in units of pages.

If the erase verify operation passes, an erase verify voltage may be adjusted at step S73. For example, the erase verify voltage may be decreased by a predetermined offset.

The erase verify operation may be repeated using the decreased erase verify voltage at step S72. In this manner, the erase verify operation of step S72 and the erase verify voltage adjustment operation of step S73 may be repeatedly performed while gradually decreasing the erase verify voltage until the erase verify operation of step S72 fails. That is, if the erase verify operation passes, the erase verify voltage may be decreased by a fixed voltage, and the erase verify operation may be repeated using the decreased erase verify voltage.

If the erase verify operation of step S72 fails, erase status information of the selected memory block may be stored in the flag storage area of the selected memory block at step S74. The erase status information may be determined based on the erase verify voltage at which the erase verify operation fails. For example, when the erase verify operation fails to the selected memory block, it may be determined that the threshold voltages of the memory cells of the selected memory block is in a high state as the erase verify voltage increases, and it may be determined that the threshold voltages of the memory cells of the selected memory block is in a low state as the erase verify voltage decreases. Therefore, the erase status information of the selected memory block may be changed depending on the erase verify voltage used when the erase verify operation fails.

FIG. 9 is a diagram illustrating a threshold voltage distribution of memory cells according to the erase operation of the present disclosure.

Referring to FIG. 9, the threshold voltage distribution during the erase pulse application operation of step S71 may correspond to [90A] of FIG. 9, and the erase verify voltage used in the erase verify operation of steps S72 and S73 may correspond to [90B] of FIG. 9.

Referring to [90A] of FIG. 9, if the erase operation is performed, threshold voltages 91, 92, and 93 of memory cells included in the selected memory block are decreased, and therefore, the memory cells may have a threshold voltage distribution 95 of an erase status. For example, the voltage level of the erase pulse applied to the well, bit lines or source line and the number of times of applying the erase pulse may be set such that the voltage of the erase pulse becomes lower than the lowest threshold voltage 91 among threshold voltages in a program status.

Referring to [90B] of FIG. 9, after the set erase pulse is applied, that is, after the step S71 of FIG. 8 is ended, an erase verify operation may be performed. The erase verify operation may be performed by sequentially using various erase verify voltages Vf1 to Vfa. Although erase verify voltages including first to ath erase verify voltages Vf1 to Vfa are illustrated in FIG. 9, erase verify voltages lower than the ath erase verify voltage Vfa may be further generated.

For example, if it is assumed that the first erase verify voltage Vf1 among the first to ath erase verify voltages Vf1 to Vfa is highest, the erase verify operation using the first erase verify voltage Vf1 may be first performed. If the threshold voltage distribution of the selected memory block is lower than the first erase verify voltage Vf1, the erase verify operation passes. Subsequently, the erase verify operation using the second erase verify voltage Vf2 lower by an offset than the first erase verify voltage Vf1 may be performed. In this manner, the erase verify operation may be repeatedly performed while gradually decreasing the erase verify voltage until the erase verify operation fails.

If the erase verify operation using the ath erase verify voltage Vfa fails, it is determined that the threshold voltage distribution of the selected memory block has been sensed, and therefore, erase status information corresponding to the ath erase verify voltage Vfa may be stored in the flag cells of the selected memory block.

The electrical characteristics of memory cells may be degraded as erase and program operations are repeated. In this case, although the memory cells are maintained in the degraded status, the program verify voltage may be adjusted based on an erase status, and thus the erase and program operations can be performed regardless of the degree of degradation of the memory cells.

Information stored in flag cells will be described with reference to FIG. 10.

FIG. 10 is a diagram illustrating status information of a memory block according to the erase operation of the present disclosure.

Referring to FIG. 10, erase status information ES1 to ESx respectively corresponding to erase verify voltages Vfa to Vfx may be stored in flag cells. For example, a flag storage area is included in each memory block, and cells included in the flag storage area are referred to as flag cells (see FIG. 6). In the erase operation, the erase status information ES1 to ESx of the selected memory block may be set to respectively correspond to the erase verify voltages Vfa to Vfx. Alternatively, the erase verify voltages Vfa to Vfx may be divided into a plurality of groups, and the erase status information ES1 to ESx may be set to respectively correspond to the respective groups. The erase status information ES1 to ESx may be implemented as different data each including a plurality of bits.

If a fail occurs for the first time in the erase verify operation using the ath erase verify voltage Vfa when the erase verify operation using a gradually decreased erase verify voltage is performed, erase status information 'ES1' corresponding to the ath erase verify voltage Vfa may be stored in the flag cells. In this manner, if a fail occurs for the first time in the erase verify operation using an xth erase verify voltage Vfx, erase status information 'ESx' corresponding to the xth erase verify voltage Vfx may be stored in the flag cells.

Figure 11:
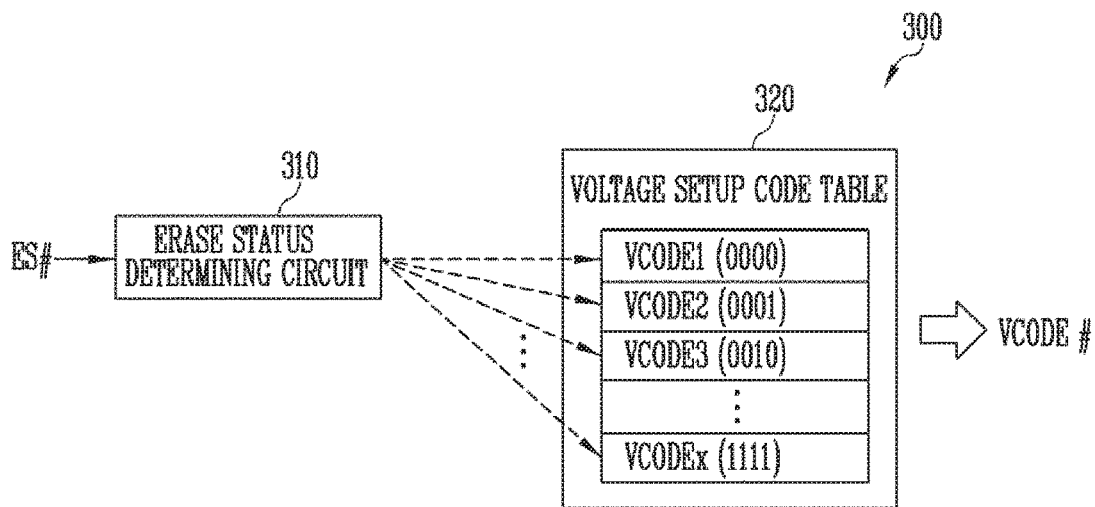
FIG. 11 is a diagram illustrating a control logic according to an embodiment of the present disclosure.

FIG. 11 is a diagram illustrating a control logic according to an embodiment of the present disclosure.

Referring to FIG. 11, the erase status information ES1 to ESx stored in the flag cells may be used to set voltages used in the program operation. For example, program verify voltages may be set according to the erase status information ES1 to ESx. To this end, the control logic 300 may include an erase status determining circuit 310 and a voltage setup code table 320.

The voltage setup code table 320 may include a plurality of voltage setup codes VCODE1 to VCODEx. The voltage setup codes VCODE1 to VCODEx may be implemented as data having different bits. For example, when each of the voltage setup codes VCODE1 to VCODEx is implemented as data of 4 bits, a first voltage setup code VCODE1 may be set to '0000,' a second voltage setup code VCODE2 may be set to '0001,', and an xth voltage setup code VCODEx may be set to '1111.' '0000' to '1111' are provided as an embodiment for helping of understanding of the present disclosure, and therefore, the pattern and number of bits of the voltage setup codes VCODE1 to VCODEx may be changed depending on the memory device 1100.

The erase status determining circuit 310 may select any one of the voltage setup codes VCODE1 to VCODEx stored in the voltage setup code table 320 according to erase status information ES # (i.e., any one of ES1 to ESx of FIG. 10) read from the flag cells of the selected memory block, and output the selected voltage setup code VCODE # (i.e., any one of VCODE1 to VCODEx). The voltage setup code VCODE # output from the control logic 300 may be transmitted to the voltage generating circuit 210 of FIG. 2, and generate voltages used in the program operation according to the received voltage setup code VCODE #.

A program operation using a voltage setup code VCODE # will be described as follows.

Figure 12:
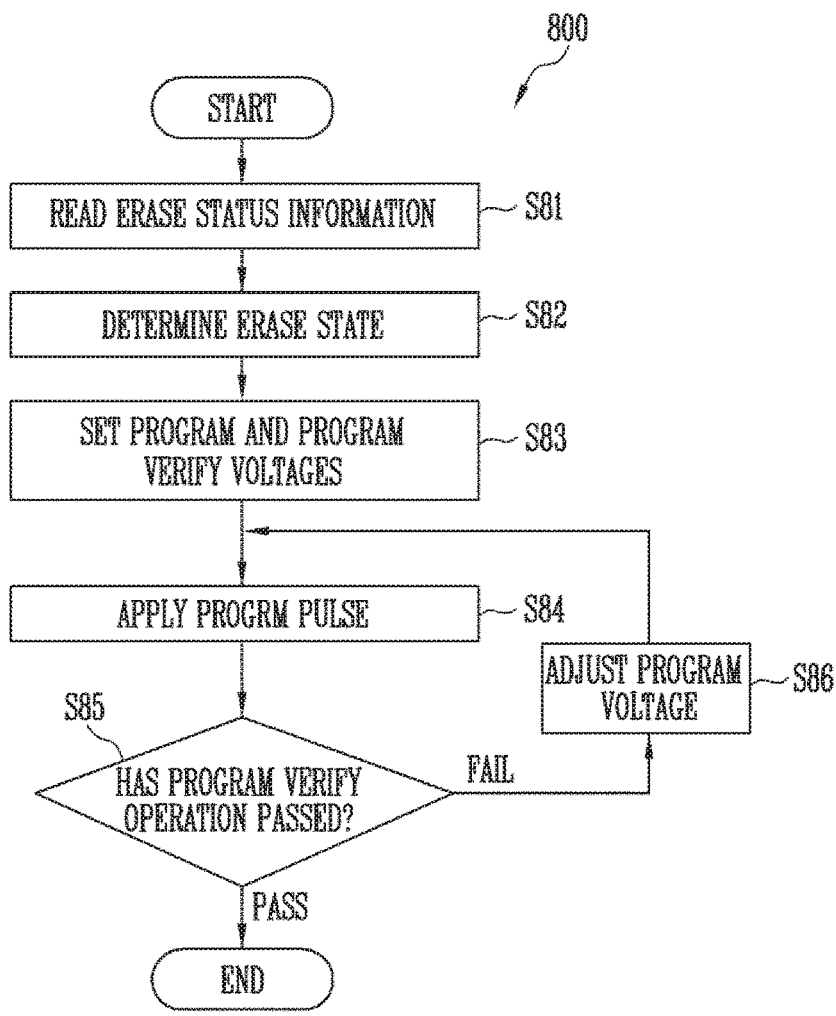
FIG. 12 is a flowchart illustrating in detail a program operation shown in FIG. 7.

FIG. 12 is a flowchart illustrating in detail the program operation of FIG. 7.

Referring to FIG. 12, if the program operation is started to a selected memory block at step S800, erase status information ES # may be read from the flag cells of the selected memory block at step S81. The erase status determining circuit 310 of the control logic 300 of FIG. 11 may determine an erase status of the selected memory block based on the erase state information ES # at step S82, and set program and program verify voltages based on the result of the determination at step S83. For example, in the step S82, the control logic 300 may output the operation code OP_CODE of FIG. 2 including the voltage setup code VCODE # based on the erase state information ES #. In the step S83, the voltage generating circuit 210 of FIG. 2 may allow voltages having various levels, which are necessary for the program operation, to be set according to the operation code OP_CODE. For example, a program voltage, a program step voltage, a pass voltage, a program verify voltage, and the like may be set. In particular, the program verify voltage may be set such that an offset is applied to the program verify voltage according to the voltage setup code VCODE # included in the operation code OP_CODE. If the voltages necessary for the program operation are set, the program operation may be performed using an incremental step pulse program (ISPP) scheme at steps S84, S85, and S86. Each step will be described in detail as follows.

A program pulse may be applied to a selected word line of the selected memory block according to a row address at step S84. If the program pulse is applied to the selected word line, as threshold voltages of selected memory cells coupled to the selected word line are increased, the memory cells may be programmed. In this case, a pass voltage may be applied to the other unselected word lines except the selected word line. The program pulse applied to the selected word line may be a pulse that has a program voltage (e.g., a positive voltage). A preset voltage may be used as the program voltage.

If the program pulse is applied for a certain time, a program verify operation may be performed on the memory cells to which the program pulse is applied at step S85. The voltage set in the step S83 is used in the program verify operation. For example, since the program verify operation is set by the voltage setup code VCODE # selected based on the erase status information, the program verify voltage is changed depending on the selected memory block. The program verify voltage may be applied to the selected word line, and pass voltages may be applied to the other unselected word lines. If the program verify operation on a selected page fails, the program voltage may be adjusted at step S86. For example, the program voltage may be increased by a program step voltage.

As the program pulse having the adjusted program voltage is again applied to the selected word line, the threshold voltages of the selected memory cells may be increased at step S85. In this manner, the program pulse application operation of step S84, the program verify operation of step S85), and the program voltage adjustment operation of step S86) may be repeatedly performed while gradually increasing the program voltage until the program verify operation passes at step S85. Here, since the program voltage is a preset voltage, the program voltage may be set regardless of the erase status information. That is, in program operations of memory blocks having different erase status information, the same program voltage may be used, but different program verify voltages may be used.

If the program verify operation passes at step S85, the program operation of the selected memory block may be ended.

In the above-described embodiment, how the program verify voltage is adjusted based on the erase status information will be described in detail as follows.

Figure 13:
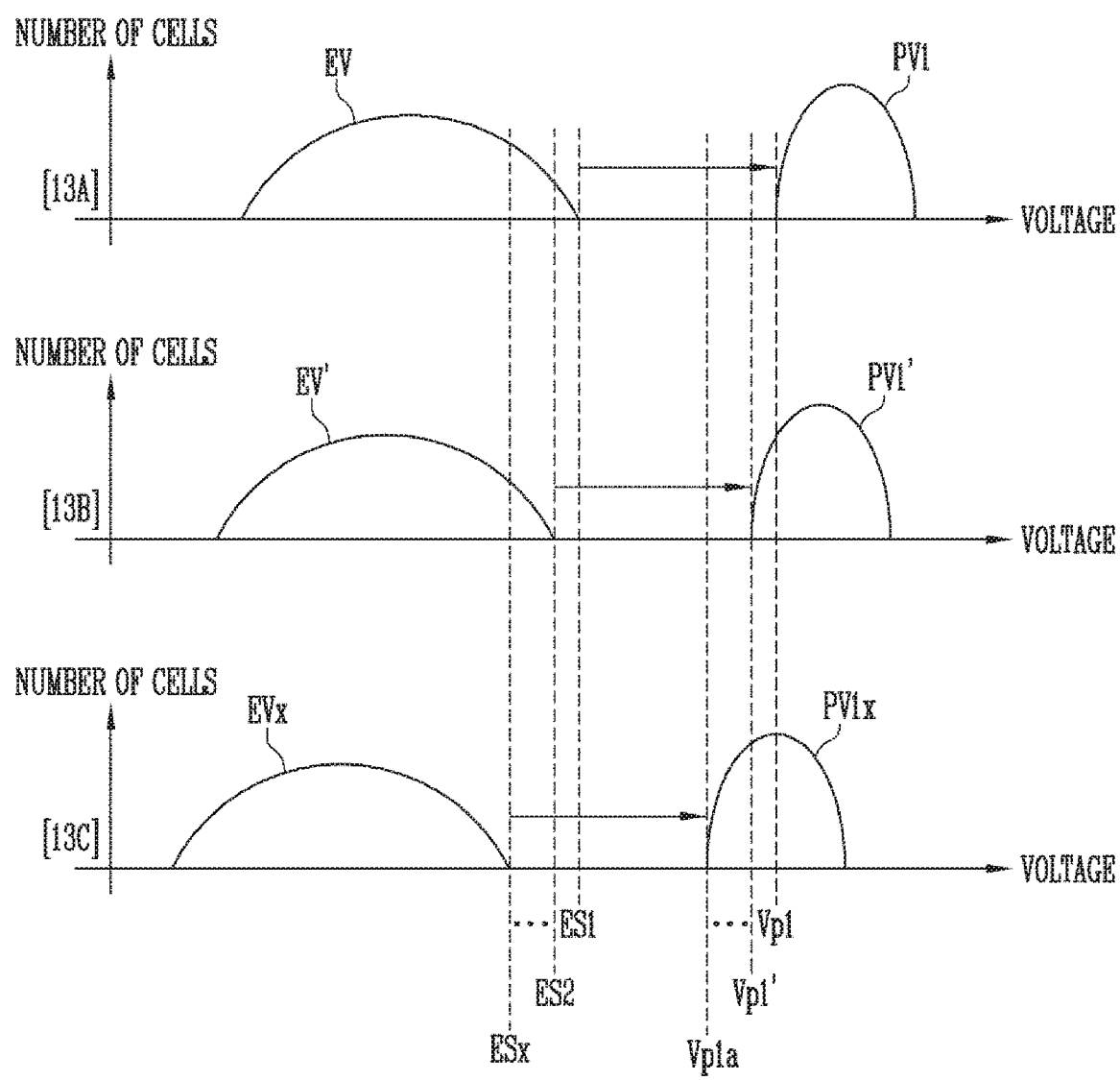
FIG. 13 is a diagram illustrating a threshold voltage distribution of memory cells according to the program operation of the present disclosure.

FIG. 13 is a diagram illustrating a threshold voltage distribution of memory cells according to the program operation of the present disclosure.

Referring to FIG. 13, since physical or electrical characteristics of memory cells are different depending on memory blocks, threshold voltage distributions of the erase status may be different from each other even when the same erase operation is performed. For example, in a first memory block having a high threshold voltage distribution EV of the erase status as shown in [13A], first erase status information ES1 may be stored in flag cells. In the first memory block, 'first' is used to distinguish the first memory block from other memory blocks in the following description, and is irrelevant to the arrangement order of memory blocks.

In a program operation of the memory block in which the first erase status information ES1 is stored, the program verify voltage is set according to the threshold voltage distribution EV of the erase status. In this case, the lowest level of threshold voltages of a first program status PV1 is defined as a first level Vp1.

An embodiment of a second memory block having a threshold voltage distribution EV' of the erase status, which is lower than that of the first memory block, is illustrated in [13B]. In [13B], since the threshold voltage distribution EV' of the erase status of the second memory block is lower than that EV of the erase status of the first memory block, second erase status information ES2 may be stored in flag cells of the second memory block. Therefore, in a program operation of the second memory block, the lowest level of threshold voltages of a first program status PV1' may be defined as a first level Vp1' lower than the first level Vp1. That is, since the threshold voltage distribution EV' of the erase status of the second memory block lower than that EV of the erase status of the first memory block, the threshold voltage distributions of the first program statuses PV1 and PV1' may be different from each other even when the first memory block and the second memory block are programmed using the same first program data. For example, the threshold voltage distribution of memory cells programmed to the first program status PV1' in the second memory block may be lower than that of memory cells programmed to the first program state PV1 in the first memory block.

As shown in [13C], when a threshold voltage distribution EVx of the erase status of an xth memory block is lowest, memory cells of the xth memory block may be programmed to a first program status PV1x that is lowest even when the same first program data is programmed in each of the first memory block (see [13A]), the second memory block (see [13B]), and the xth memory block (see [13C]). For example, in a program operation of the xth memory block, the lowest level of threshold voltages of the first program status PV1x may be defined as a first level Vp1a that is lowest among the threshold voltages of first program statuses of the other memory blocks.

That is, the threshold voltage distribution of the program status may be changed depending on the threshold voltage distribution of the erase state even when the same program data is programmed in different memory blocks.

In a program operation performed based on the above-described embodiment, various exemplary threshold voltage distributions of the memory cells will be described with reference to FIGS. 14 and 15.

Figure 14:
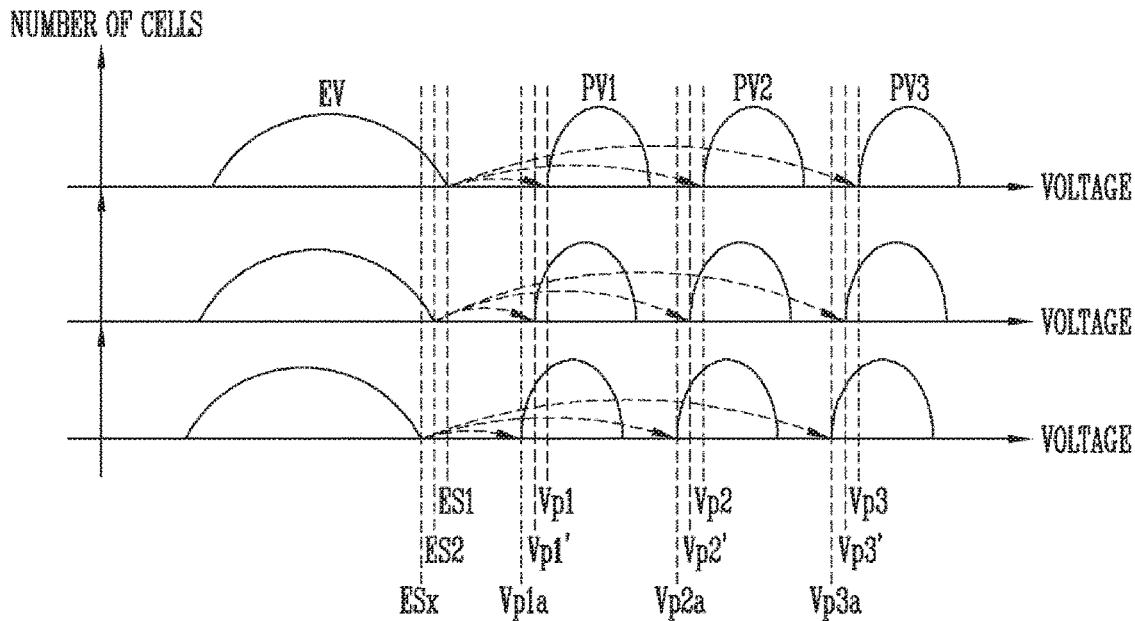
FIG. 14 is a diagram illustrating a threshold voltage distribution of memory cells, caused by the program operation, according to an embodiment of the present disclosure.

FIG. 14 is a diagram illustrating a threshold voltage distribution of memory cells, caused by a program operation, according to an embodiment of the present disclosure.

Referring to FIG. 14, in the case of a multi-level cell having 2 bits of data stored therein, memory cells may have a threshold voltage distribution of an erase status EV, a first program status PV1, a second program status PV2 or a third program status PV3. Although program operations using the same program data are performed on different memory blocks, threshold voltage distributions may be differently programmed depending on the erase status information ES1 to ESx.

If it is assumed that a memory block having the highest threshold voltage distribution of the erase state is a first memory block, first erase status information ES1 may be stored in flag cells of the first memory block. If memory cells included in the first memory block are programmed to first to third program statuses PV1 to PV3, the lowest levels of the program statuses may be defined as first level Vp1, a second level Vp2, and a third level Vp3, respectively.

If it is assumed that a memory block having a threshold voltage distribution of the erase state, which is lower than that of the first memory block, is a second memory block, second erase status information ES2 may be stored in flag cells of the second memory block. If memory cells included in the second memory block are programmed to the first to third program statuses PV1 to PV3, the lowest levels of the program statuses may be defined as a first level Vp1', a second level Vp2', and a third level Vp3', which are lower than those of the first memory block, respectively.

If it is assumed that a memory block having the lowest threshold voltage distribution of the erase state is an xth memory block, xth erase status information ESx may be stored in flag cells of the xth memory block. If memory cells included in the xth memory block are programmed to the first to third program statuses PV1 to PV3, the lowest levels of the program statuses may be defined as a first level Vp1$a$, a second level Vp2$a$, and a third level Vp3$a$, which are lower than those of the other memory blocks, respectively.

As described above, although program operations using the same program data are performed, threshold voltage distributions are differently programmed depending on the erase status information. Therefore, read voltages used in read operations may also be different set for every memory device depending on erase status information.

Figure 15:
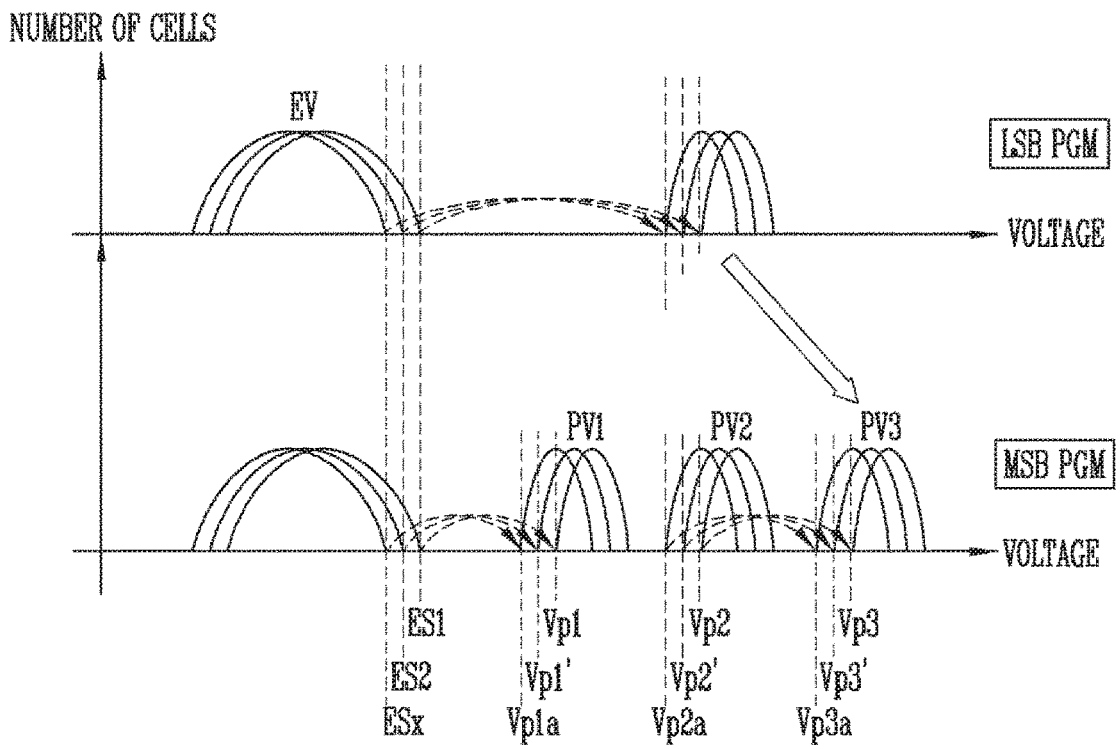
FIG. 15 is a diagram illustrating another embodiment of the program operation shown in FIG. 14.

FIG. 15 is a diagram illustrating another embodiment of the program operation shown in FIG. 14.

Referring to FIG. 15, an LSB program operation LSB PGM and an MSB program operation MSB PGM may be sequentially performed on memory cells in an erase status EV to be programmed. For example, the LSB program operation LSB PGM may be first performed on memory cells to be programmed to second and third program statuses PV2 and PV3. In the LSB program operation LSB PGM, the memory cells may be programmed such that threshold voltage distributions of the memory cells are different from one another according to erase status information ES1 to ESx.

The MSB program operation MSB PGM may be performed on some of memory cells on which the LSB program operation LSB PGM is not performed to become memory cells in a first program status PV1, and the MSB program operation MSB PGM may be performed on some of the memory cells on which the LSB program operation LSB PGM is performed to be divided into memory cells having the second and third program statuses PV2 and PV3.

As described above, the LSB and MSB program operations LSB PGM and MSB PGM may be performed according to the erase status information ES1 to ESx, and therefore, final threshold voltage distributions may be different from one another according to the erase status information ES1 to ESx.

Figure 16:
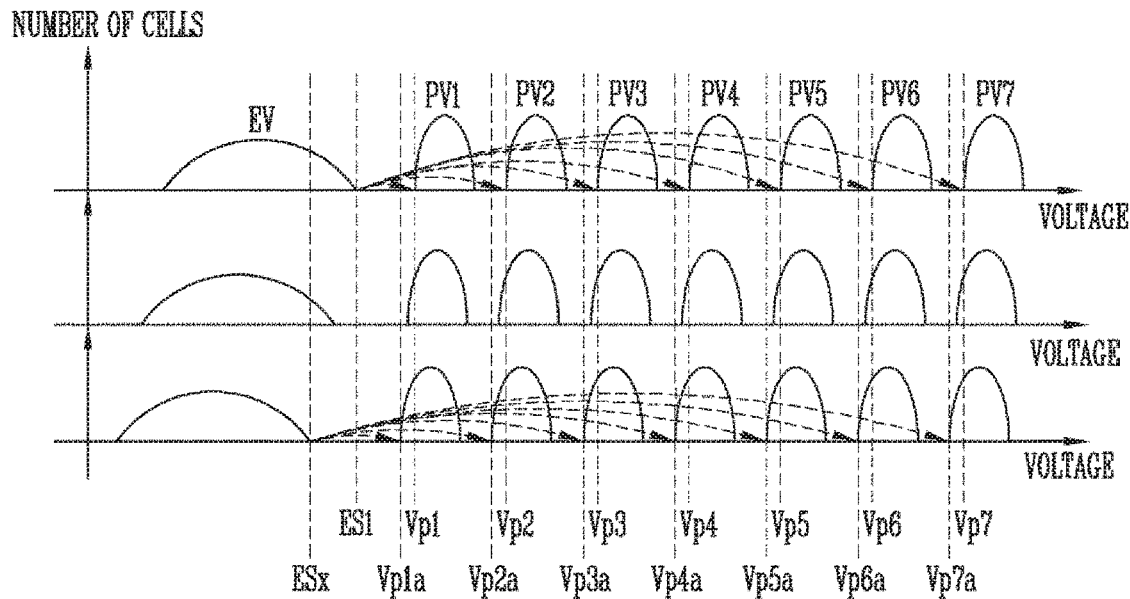
FIG. 16 is a diagram illustrating a threshold voltage distribution of memory cells, caused by the program operation, according to another embodiment of the present disclosure.

FIG. 16 is a diagram illustrating a threshold voltage distribution of memory cells, caused by the program operation, according to another embodiment of the present disclosure.

Referring to FIG. 16, in the case of a triple level cell having 3 bits of data stored therein, memory cells may have threshold voltage distributions corresponding to an erase status EV and first to seventh program statuses PV1 to PV7. As described in the above-described embodiment, although program operations using the same program data are performed on different memory blocks, threshold voltage distributions may be differently programmed depending on the erase status information ES1 to ESx for each memory block.

If it is assumed that a memory block having the highest threshold voltage distribution of the erase state is a first memory block, first erase status information ES1 may be stored in flag cells of the first memory block. If memory cells included in the first memory block are programmed to the first to seventh program statuses PV1 to PV7, the lowest levels of the program statuses may be defined as first to seventh levels Vp1 to Vp7, respectively.

If it is assumed that a memory block having the lowest threshold voltage distribution of the erase state is an xth memory block, xth erase status information ESx may be stored in flag cells of the xth memory block. If memory cells included in the xth memory block are programmed to the first to seventh program statuses PV1 to PV7, the lowest levels of the program statuses may be defined as first to seventh levels Vp1$a$ to Vp7$a$, which are lower than those of the other memory blocks, respectively.

As described above, although program operations using the same program data are performed, threshold voltage distributions are differently programmed depending on erase status information. Therefore, read voltages used in read operations may also be different set for every memory device depending on erase status information.

In addition, the above-described embodiment may be applied to memory devices in which 4 bits or more of data are stored in one memory cell.

Figure 17:
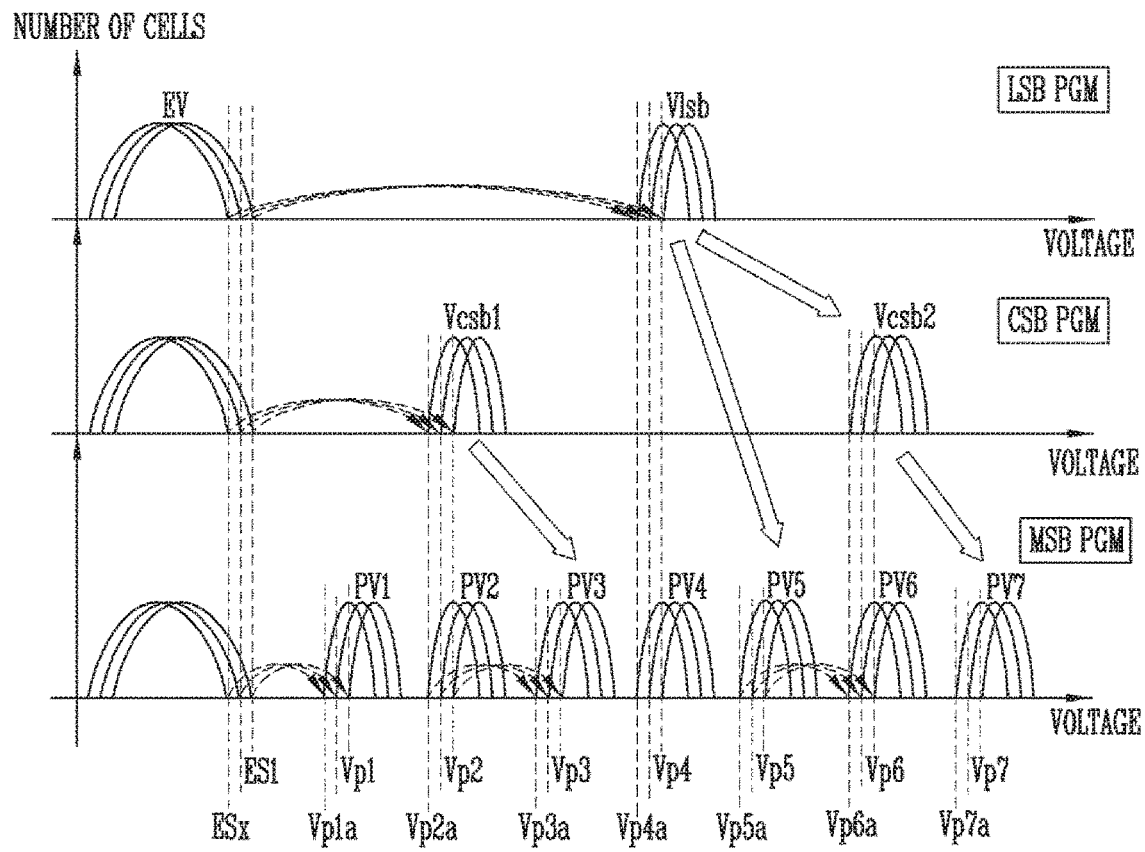
FIG. 17 is a diagram illustrating another embodiment of the program operation shown in FIG. 16.

FIG. 17 is a diagram illustrating another embodiment of the program operation shown in FIG. 16.

Referring to FIG. 17, memory cells may be programmed such that threshold voltage distributions of the memory cells are different from one another according to erase status information ES1 to ESx.

An LSB program operation LSB PGM, a CSB program operation CSB PGM, and an MSB program operation MSB PGM may be sequentially performed on memory cells in an erase status EV to be programmed. For example, the LSB program operation LSB PGM may be first performed on memory cells to be programmed to fourth to seventh program statuses PV4 to PV7. In the LSB program operation LSB PGM, the memory cells may be programmed such that threshold voltage distributions of the memory cells are different from one another according to the erase status information ES1 to ESx.

The CSB program operation CSB PGM may be performed on some of memory cells on which the LSB program operation LSB PGM is not performed and some of the memory cells on which the LSB program operation LSB PGM is performed. For example, some of the memory cells on which LSB program operation LSB PGM is not performed may be programmed to a first CSB status Vcsb1, and some of the memory cells on which the LSB program operation LSB PGM is performed may be programmed to a second CSB status Vcsb2. The memory cells programmed to the first CBS status Vcsb1 may be memory cells to be programmed to a second or third program status PV2 or PV3. The memory cells programmed to the second CBS status Vcsb2 may be memory cells to be programmed to a sixth or seventh program status PV6 or PV7. In the CSB program operation CSB PGM, the memory cells may be programmed such that threshold voltage distributions of the memory cells are different from one another according to the erase status information ES1 to ESx.

Subsequently, the MSB program operation MSB PGM may be performed on such that memory cells reach a final target level. For example, the MSB program operation may be performed such that memory cells to be programmed are divided into memory cells in first to seventh program statuses PV1 to PV7. In the MSB program operation MSB PGM, the memory cells may be programmed such that threshold voltage distributions of the memory cells are different from one another according to the erase status information ES1 to ESx.

FIG. 18 is a diagram illustrating a method for searching for an erase verify voltage according to an embodiment of the present disclosure.

Referring to FIG. 18, the threshold voltage distribution during the erase pulse application operation of the step S71 may correspond to [181A] of FIG. 18, and the erase verify voltage used in the erase verify operation of the steps S72 and S73 may correspond to [181B] of FIG. 18.

Referring to [181A] of FIG. 18, when an erase operation is performed, threshold voltages 181, 182, and 183 of memory cells included in a selected memory block are decreased, and thus the memory cells have a threshold voltage distribution 185 in the erase status. For example, the voltage level and application number of an erase pulse applied to a well, bit lines or a source line may be set such that the voltage of the erase pulse is lower than the lowest threshold voltage 181 among the threshold voltages in the program status.

Referring to [181B] of FIG. 18, after the erase pulse is applied the set number of times (after the step S71 is ended), an erase verify operation may be performed. The erase verify operation may be performed by sequentially using various erase verify voltages Vf1 to Vfb (b is a positive integer). In the embodiment of FIG. 18, the erase verify voltages Vf1 to Vfb may be set as voltages gradually increased from a first erase verify voltage Vf1 to a bth erase verify voltage Vfb. That is, the erase verify voltage may be increased by an offset.

For example, when the erase verify operation using the lowest first erase verify voltage Vf1 fails (FAIL), the erase verify operation using the second erase verify voltage Vf2 higher than the first erase verify voltage Vf1 may be performed. In this manner, the erase verify operation may be repeatedly performed while gradually increasing the erase verify voltage until the erase verify operation passes (PASS). That is, unlike FIG. 9, the erase verify operation may be repeated while increasing the erase verify voltage. For example, when the erase verify operations using the first to (b−1)th erase verify voltages Vf1 to Vfb−1 all fail (FAIL) and the erase verify operation using the bth erase verify voltage Vfb passes (PASS), erase status information corresponding to the bth erase verify voltage Vfb may be stored in flag cells of the selected memory block.

FIG. 19 is a diagram illustrating a method for searching for an erase verify voltage according to another embodiment of the present disclosure.

Referring to FIG. 19, if an erase verify operation is performed using the method described in FIG. 18 when an erase operation is not normally performed, the time required to perform the erase verify operation may increase. For example, when a threshold voltage distribution 184 of memory cells is not sufficiently lowered in the erase pulse application operation of the step S71 [181C], a plurality of erase verify voltages Vf1 to Vfb may be used until the erase verify operation passes, and therefore, the time required to perform the erase verify operation may increase.

In the embodiment of FIG. 19, in order to prevent the time required to perform the erase verify operation from increasing to infinity, when an erase verify number N_ER where an erase verify voltage is used is preset, and the erase verify operation fails (FAIL) until the use number of the erase verify voltage reaches the erase verify number N_ER, the erase pulse application operation of the step S71 may be additionally performed as shown in [181D] (A_ER). When the erase pulse application operation is additionally performed, the threshold voltage distribution 184 of the memory cells may be lowered as shown in '185'. In this manner, when the use number of the erase verify voltage does not reach the erase verify number N_ER, the erase pulse application operation of the step S71 and the erase verify operation of the steps S72 and S73 may be repeated until the erase verify operation passes.

When the erase verify operation does not pass until the repetition number of the erase pulse application operation of the step S71 and the erase verify operation of the steps S72 and S73 reaches a set number (different from the erase verify number), the corresponding memory block may be processed as a bad block.

As described in FIG. 18 or 19, when the erase verify operation passes, erase status information may be stored according to the erase verify voltage at which the erase verify operation passes.

Figure 20:
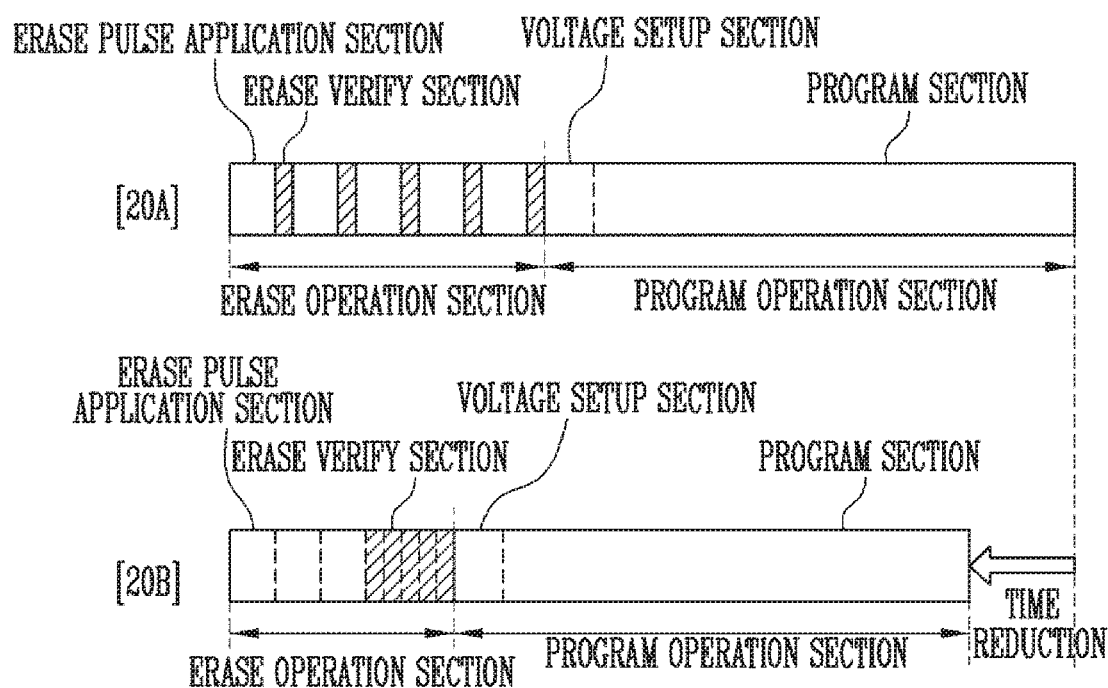
FIG. 20 is a diagram illustrating an operation time of the memory device according to an embodiment of the present disclosure.

FIG. 20 is a diagram illustrating an operation time of the memory device according to an embodiment of the present disclosure.

Referring to FIG. 20, [20A] is a diagram illustrating an operation time according to a conventional art, and [20B] is a diagram illustrating an operation time according to this embodiment.

Referring to [20A], in an erase operation using a general ISPE scheme, an erase pulse application section and an erase verify section may be repeatedly performed during an erase operation section. For example, if an erase pulse is applied to a well, bit lines or a source line once, an erase verify operation of a selected memory block may be performed. One erase verify voltage may be used during the erase operation section, and the erase pulse application section and the erase verify section may be repeatedly performed until the erase verify operation passes.

If the erase verify operation passes, a program operation may be performed.

In a program operation using an ISPP scheme, a program section may be started after a voltage setup section is ended. For example, voltages having various levels, such as a program voltage, a pass voltage, and a program verify voltage, which are to be used in the program operation, may be set in the voltage setup section. If the voltages to be used in the program operation are set, the program operation may be performed using the ISPP scheme during the program section. At this time, since the same program verify voltage is set with respect to the same program data, memory cells programmed with respect to the same program data in different memory blocks may have threshold voltage distributions of the same program status. In this case, since an erase operation, into which physical or electrical characteristics are not reflected, is performed for every memory block, it may take a long time to perform the erase or program operation to a memory block including many cells of program or erase operation speed is fast or slow.

Referring to [20B], in an erase operation according to an embodiment of the present invention, after an erase pulse application section is consecutively performed during an erase operation section, an erase verify section may be consecutively performed. For example, an erase pulse may be applied to a well, bit lines or a source line a preset number of times in the erase pulse application section. That is, a substantial erase operation for decreasing threshold voltages of memory cells may be ended in the erase pulse application section. If the erase pulse is applied to the well, bit lines or source line according to the preset number of times, an erase verify section for detecting a threshold voltage distribution of an erase status may be consecutively performed. For example, the erase verify operation may be performed using an erase verify voltage that is gradually decreased from the highest erase verify voltage. In this case, unlike [16A], if the erase verify voltage passes, the erase verify operation may be repeated by decreasing the erase verify voltage. If the erase verify operation fails, the erase verify operation may be ended. As such, the threshold voltages of the memory cells are decreased using the erase pulse that is applied a small number of times, and the decreased threshold voltages are detected through the erase verify operation, so that the time taken to perform the erase operation section of [20B] can be shorter than that taken to perform the erase operation section of [20A]. If the erase verify operation fails, a program operation section may be started after erase status information is stored in flag cells of a selected memory block.

The program operation may be performed using the ISPP scheme, and be performed in the same manner as [20A]. However, in [20B], the threshold voltage distribution of the erase status is formed according to characteristics of the memory block, and the program verify voltage is determined based on the threshold voltage distribution of the erase status. Thus, the program operation time can be reduced in addition to the erase operation.

Figure 21:
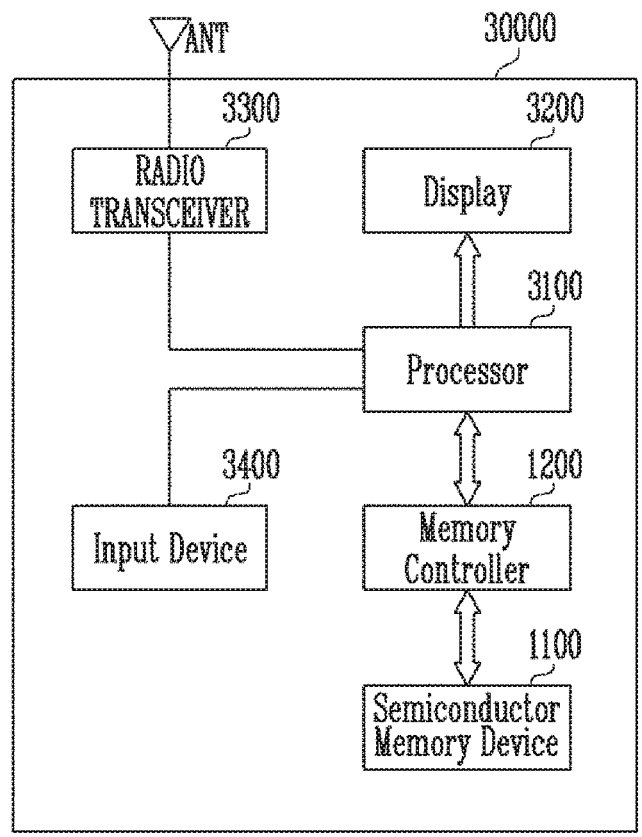
FIG. 21 is a diagram illustrating another embodiment of the memory system including the memory device shown in FIG. 2.

FIG. 21 is a diagram illustrating another embodiment of the memory system including the memory device shown in FIG. 2.

Referring to FIG. 21, the memory system 30000 may be implemented as a cellular phone, a smart phone, a tablet PC, a personal digital assistant (PDA), or a wireless communication device. The memory system 30000 may include a memory device 1100 and a memory controller 1200 capable of controlling an operation of the memory device 1100. The memory controller 1200 may control a data access operation of the memory device 1100, e.g., a program operation, an erase operation, a read operation, or the like under the control of a processor 3100.

Data programmed in the memory device 1100 may be displayed through a display 3200 under the control of the memory controller 1200.

A radio transceiver 3300 may transmit/receive radio signals through an antenna ANT. For example, the radio transceiver 3300 may convert a radio signal received through the antenna ANT into a signal that can be processed by the processor 3100. Therefore, the processor 3100 may process a signal output from the radio transceiver 3300 and transmit the processed signal to the memory controller 1200 or the display 3200. The memory controller 1200 may program the signal processed by the processor 3100 in the semiconductor memory device 1100.

Also, the radio transceiver 3300 may convert a signal output from the processor 3100 into a radio signal, and output the converted radio signal to an external device through the antenna ANT. An input device 3400 is a device capable of inputting a control signal for controlling an operation of the processor 3100 or data to be processed by the processor 3100, and may be implemented as a pointing device such as a touch pad or a computer mouse, a keypad, or a keyboard. The processor 3100 may control an operation of the display 3200 such that data output from the memory controller 1200, data output from the radio transceiver 3300, or data output from the input device 3400 can be output through the display 3200.

In some embodiments, the memory controller 1200 capable of controlling an operation of the memory device 1100 may be implemented as a part of the processor 3100, or be implemented as a chip separate from the processor 3100.

Figure 22:
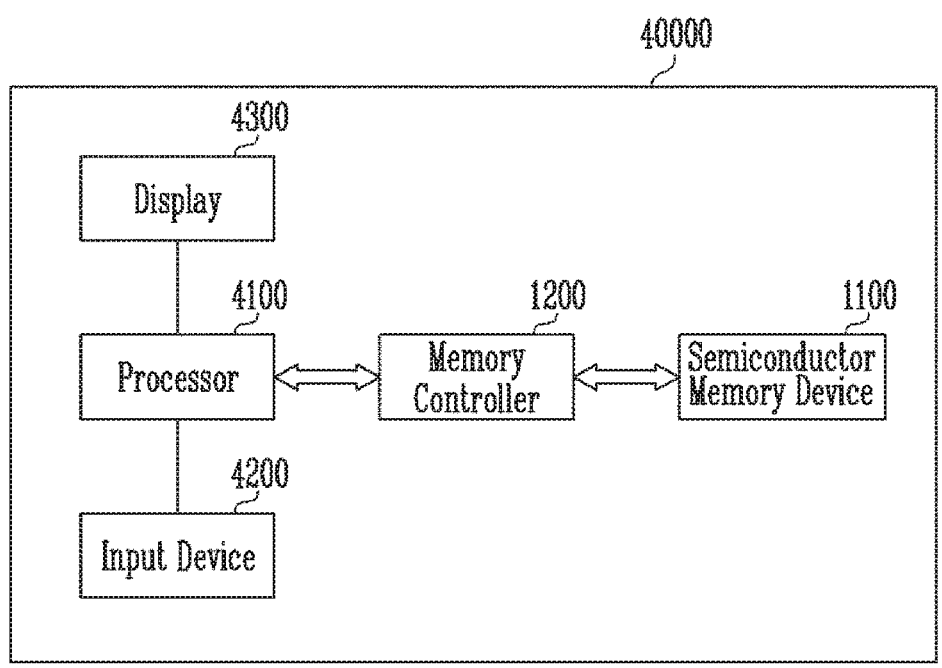
FIG. 22 is a diagram illustrating another embodiment of the memory system including the memory device shown in FIG. 2.

FIG. 22 is a diagram illustrating another embodiment of the memory system including the memory device shown in FIG. 2.

Referring to FIG. 22, the memory system 40000 may be implemented as a personal computer (PC), a tablet PC, a net-book, an e-reader, a personal digital assistant (PDA), a portable multimedia player (PMP), an MP3 player, or an MP4 player.

The memory system 40000 may include a memory device 1100 and a memory controller 1200 capable of controlling a data processing operation of the memory device 1100.

A processor 4100 may output data stored in the memory device 1100 through a display 4300 according to data input through an input device 4200. For example, the input device 4200 may be implemented as a pointing device such as a touch pad or a computer mouse, a keypad, or a keyboard.

The processor 4100 may control overall operations of the memory system 40000, and control an operation of the memory controller 1200. In some embodiments, the memory controller 1200 capable of controlling an operation of the memory device 1100 may be implemented as a part of the processor 4100, or be implemented as a chip separate from the processor 4100.

Figure 23:
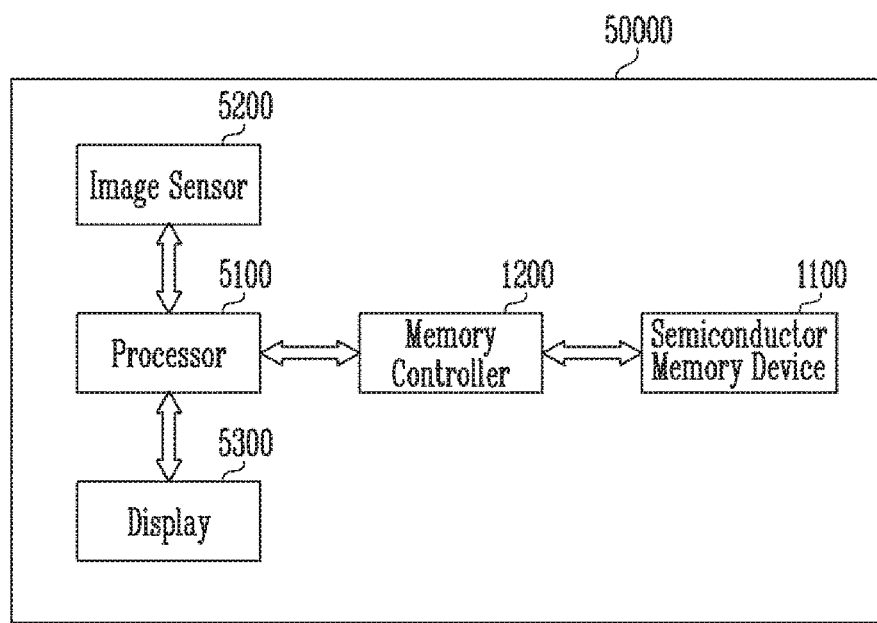
FIG. 23 is a diagram illustrating another embodiment of the memory system including the memory device shown in FIG. 2.

FIG. 23 is a diagram illustrating another embodiment of the memory system including the memory device shown in FIG. 2.

Referring to FIG. 23, the memory system 50000 may be implemented as an image processing device, e.g., a digital camera, a mobile terminal having a digital camera attached thereto, a smart phone having a digital camera attached thereto, or a tablet PC having a digital camera attached thereto.

The memory system 50000 may include a memory device 1100 and a memory controller 1200 capable of controlling a data processing operation of the memory device 1100, e.g., a program operation, an erase operation, or a read operation.

An image sensor 5200 of the memory system 50000 may convert an optical image into digital signals, and the converted digital signals may be transmitted to a processor 5100 or the memory controller 1200. Under the control of the processor 5100, the converted digital signals may be output through a display 5300, or be stored in the memory device 1100 through the memory controller 1200. In addition, data stored in the memory device 1100 may be output through the display 5300 under the control of the processor 5100 or the memory controller 1200.

In some embodiments, the memory controller 1200 capable of controlling an operation of the memory device 1100 may be implemented as a part of the processor 5100, or be implemented as a chip separate from the processor 5100.

Figure 24:
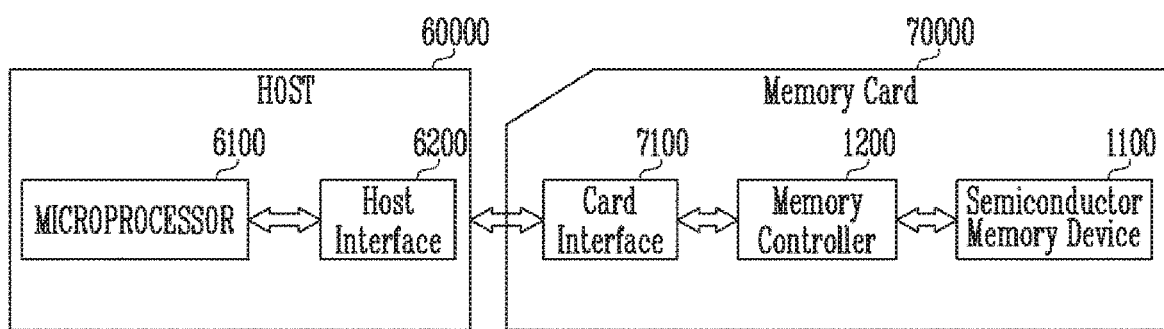
FIG. 24 is a diagram illustrating another embodiment of the memory system including the memory device shown in FIG. 2.

FIG. 24 is a diagram illustrating another embodiment of the memory system including the memory device shown in FIG. 2.

Referring to FIG. 24, the memory system 70000 may be implemented as a memory card or a smart card. The memory system 70000 may include a memory device 1100, a memory controller 1200, and a card interface 7100.

The memory controller 1200 may control data exchange between the memory device 1100 and the card interface 7100. In some embodiments, the card interface 7100 may be a secure digital (SD) card interface or a multi-media card (MMC) interface, but the present disclosure is not limited thereto.

The card interface 7100 may interface data exchange between a host 60000 and the memory controller 1200 according to a protocol of the host 60000. In some embodiments, the card interface 7100 may support a universal serial bus (USB) protocol and an inter-chip (IC)-USB protocol. Here, the card interface 7100 may mean hardware capable of supporting a protocol used by the host 60000, software embedded in the hardware, or a signal transmission scheme.

When the memory system 70000 is coupled to a host interface 6200 of the host 60000 such as a PC, a tablet PC, a digital camera, a digital audio player, a cellular phone, console video game hardware, or a digital set-top box, the host interface 6200 may perform data communication with the memory device 1100 through the card interface 7100 and the memory controller 1200 under the control of a microprocessor 6100.

According to the present disclosure, the operating speed of the memory device can be improved by improving the erase operation of the memory device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory device comprising:
a peripheral circuit configured to decrease threshold voltages of memory cells included in a selected memory block and then perform an erase verify operation for detecting a threshold voltage distribution of the memory cells, wherein the peripheral circuit applies an erase pulse to a well, bit lines or a source line included in the selected memory block a preset number of times; and
a control logic configured to output a voltage setup code according to the threshold voltage distribution of an erase status, which is detected by the erase verify operation,
wherein, when the erase verify operation is performed, the peripheral circuit uses an erase verify voltage that is gradually decreased and repeats the erase verify operation until the erase verify operation fails.

2. The memory device of claim 1, wherein, when the erase pulse is applied to the well, the bit lines or the source line plural times, the peripheral circuit consecutively applies the erase pulse to the well.

3. The memory device of claim 1, wherein the erase verify voltage is gradually decreased by an offset from a preset erase verify voltage.

4. The memory device of claim 3, wherein, if the erase verify operation passes, the peripheral circuit performs the erase verify operation, using an erase verify voltage that is lower by the offset than the erase verify voltage at which the erase verify operation passes.

5. The memory device of claim 3, wherein the control logic controls the peripheral circuit such that the erase verify operation is repeated while gradually decreasing the erase verify voltage until the erase verify operation fails.

6. The memory device of claim 5, wherein, if the erase verify operation fails, the control logic controls the peripheral circuit to store erase status information corresponding to the erase verify voltage used in erase verify operation that fails in flag cells of the selected memory block.

7. The memory device of claim 6, wherein the control logic includes an erase status determining circuit configured to determine the threshold voltage distribution of the erase status, based on the erase status information, in a program operation.

8. The memory device of claim 7, wherein the erase status determining circuit selects the voltage setup code, based on the erase status information.

9. The memory device of claim 7, wherein the control logic includes a voltage setup code table in which various different voltage setup codes are stored, to output the voltage setup code.

10. The memory device of claim 1, wherein the peripheral circuit sets a program verify voltage according to the voltage setup code.

11. The memory device of claim 1, wherein the control logic selectively outputs the voltage setup code such that a program verify voltage is set lower as the threshold voltage distribution of the selected memory block becomes lower.

12. The memory device of claim 1, wherein, when a program operation is performed, the peripheral circuit generates a program verify voltage according to the voltage setup code.

13. A method for operating a memory device, the method comprising:
applying an erase pulse to a selected memory block;
after the erase pulse is applied, setting a program verify voltage according to an erase status of the selected memory block; and
performing a program operation of the selected memory block, using the program verify voltage,
wherein the setting of the program verify voltage includes performing an erase verify operation,
wherein the erase verify operation is repeated until the erase verify operation fails, and
wherein the erase verify operation uses an erase verify voltage that is gradually decreased.

14. The method of claim 13, wherein, in the applying of the erase pulse to the selected memory block, the erase pulse is applied to a well, bit lines or a source line included in the selected memory block.

15. The method of claim 11, wherein, when the erase pulse is applied to the well, the bit lines or the source line plural times, the erase pulse is consecutively applied to the well, the bit lines or the source line.

16. The method of claim 10, wherein the setting of the program verify voltage further includes:
- if the erase verify operation fails, store erase status information in the selected memory block according to the erase verify voltage used in the erase verify operation that fails;
- outputting a voltage setup code, based on the erase status information, in a program operation; and
- setting the program verify voltage according to the output voltage setup code.

17. The method of claim 13, wherein the erase verify operation:
- passes if threshold voltages of all memory cells included in the selected memory block are lower than the erase verify voltage; and
- fails if a memory cell of which erase verify voltage is higher than the erase verify voltage is detected among the memory cells included in the selected memory block.

18. The method of claim 16, wherein, if the erase verify operation passes, the erase verify voltage is decreased by an offset voltage, and the erase verify operation is again performed.

19. The method of claim 18, wherein the erase verify operation is consecutively performed until the erase verify operation fails.

20. A method for operating a memory device, the method comprising:
- performing an erase operation on memory cells;
- setting a program verify voltage according to threshold voltages of the erased memory cells; and
- performing a program operation on the erased memory cells, using the program verify voltage,
- wherein the performing of the erase operation includes storing erase status information of the memory cells in flag cells according to the threshold voltages of the erased memory cells,
- wherein the setting of the program verify voltage includes performing an erase verify operation,
- wherein the erase verify operation is repeated until the erase verify operation fails, and
- wherein the erase verify operation uses an erase verify voltage that is gradually decreased".

21. The method of claim 20, wherein the performing of the erase operation further includes consecutively applying an erase pulse to a well, bit lines or a source line included in the memory cells up to a certain number of times.

22. The method of claim 21, wherein, in the setting of the program verify voltage, the program verify voltage is set in response to a voltage setup code selected based on the erase status information among a plurality of different voltage setup codes.

23. The method of claim 2, wherein the program operation is performed using the program verify voltage set according to the voltage setup code and a preset program voltage.

24. A method for operating a memory device, the method comprising:
- applying an erase pulse to a selected memory block; after the erase pulse is applied, setting a program verify voltage according to an erase status of the selected memory block; and
- performing a program operation of the selected memory block, using the program verify voltage,
- wherein the erase verify operation is repeated until the erase verify operation passes, and
- wherein the setting of the uses a gradually increased erase verify voltage.

25. The method of claim 24, wherein the setting of the program verify voltage further includes:
- when the erase verify operation passes, storing erase status information in the selected memory block according to the erase verify voltage used in the passed erase verify operation;
- outputting a voltage setup code, based on the erase status information, in a program operation; and
- setting the program verify voltage according to the output voltage setup code.

* * * * *